(12) United States Patent
Ohmae et al.

(10) Patent No.: US 10,823,337 B2
(45) Date of Patent: *Nov. 3, 2020

(54) LIGHT EMITTING APPARATUS, LIGHT EMITTING UNIT, DISPLAY APPARATUS, ELECTRONIC DEVICE AND LIGHT EMITTING ELEMENT

(71) Applicant: Sony Semiconductor Solutions Corporation, Kanagawa (JP)

(72) Inventors: Akira Ohmae, Kanagawa (JP); Yusuke Kataoka, Kanagawa (JP); Ippei Nishinaka, Kanagawa (JP); Tatsuo Ohashi, Kanagawa (JP); Gen Sakoda, Tokyo (JP); Goshi Biwa, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/194,261

(22) Filed: Nov. 16, 2018

(65) Prior Publication Data

US 2019/0086035 A1 Mar. 21, 2019

Related U.S. Application Data

(63) Continuation of application No. 14/494,686, filed on Sep. 24, 2014, now Pat. No. 10,168,004.

(30) Foreign Application Priority Data

Oct. 1, 2013 (JP) .................. 2013-206590
Feb. 13, 2014 (JP) .................. 2014-025755

(51) Int. Cl.
*F21K 9/00* (2016.01)
*G09G 3/32* (2016.01)
(Continued)

(52) U.S. Cl.
CPC ............. *F21K 9/00* (2013.01); *G09G 3/2003* (2013.01); *G09G 3/32* (2013.01); *F21Y 2105/10* (2016.08);
(Continued)

(58) Field of Classification Search
CPC .......... F21K 9/00; G09G 3/2003; G09G 3/32; G09G 2320/045; G09G 2320/0242;
(Continued)

(56) References Cited

U.S. PATENT DOCUMENTS 8,033,706 B1 * 10/2011 Kelly .................. G02B 6/0036
362/307
9,048,396 B2 * 6/2015 Lowes ...................... F21V 9/00
(Continued)

FOREIGN PATENT DOCUMENTS

CN 101202321 A 6/2008
CN 101278414 A 10/2008
(Continued)

OTHER PUBLICATIONS

†U.S. Appl. No. 14/494,686, filed Sep. 24, 2014, Ohmae et al.
(Continued)

*Primary Examiner* — Amy Onyekaba
(74) *Attorney, Agent, or Firm* — Wolf, Greenfield & Sacks, P.C.

(57) ABSTRACT

There is provided a light emitting apparatus, including a plurality of light emitting elements having biased light properties; and a mounting substrate where the light emitting elements are arranged such that the biased light properties are complemented within a group including at least two light emitting elements among a plurality of the light emitting elements. Also, there are provided a light emitting unit, a display apparatus, an electronic device and a light emitting element using a plurality of point light sources.

6 Claims, 25 Drawing Sheets

(51) Int. Cl.
| | |
|---|---|
| G09G 3/20 | (2006.01) |
| H01L 25/075 | (2006.01) |
| H01L 33/20 | (2010.01) |
| H01L 33/46 | (2010.01) |
| F21Y 105/12 | (2016.01) |
| F21Y 105/10 | (2016.01) |
| F21Y 115/10 | (2016.01) |
| F21Y 107/50 | (2016.01) |

(52) U.S. Cl.
CPC ....... *F21Y 2105/12* (2016.08); *F21Y 2107/50* (2016.08); *F21Y 2115/10* (2016.08); *G09G 2320/0242* (2013.01); *G09G 2320/045* (2013.01); *H01L 25/0753* (2013.01); *H01L 33/20* (2013.01); *H01L 33/46* (2013.01); *H01L 2924/0002* (2013.01)

(58) Field of Classification Search
CPC .............. F21Y 2107/50; F21Y 2115/10; F21Y 2105/10; F21Y 2105/12; F21Y 2105/00; H01L 2924/0002; H01L 33/46; H01L 33/20; H01L 25/0753
See application file for complete search history.

(56) References Cited

U.S. PATENT DOCUMENTS

| | | | | |
|---|---|---|---|---|
| 9,818,919 | B2* | 11/2017 | Lowes | H01L 33/502 |
| 9,865,780 | B2* | 1/2018 | Lowes | F21V 9/00 |
| 2004/0070333 | A1* | 4/2004 | Lin | H01L 33/60 |
| | | | | 313/500 |
| 2004/0217364 | A1* | 11/2004 | Tarsa | H01L 25/0753 |
| | | | | 257/89 |
| 2005/0243567 | A1* | 11/2005 | Bruchhage | B60Q 3/14 |
| | | | | 362/489 |
| 2006/0237636 | A1* | 10/2006 | Lyons | H05B 35/00 |
| | | | | 250/228 |
| 2006/0274227 | A1* | 12/2006 | Komoto | G02B 6/0068 |
| | | | | 349/71 |
| 2007/0235639 | A1* | 10/2007 | Rains, Jr. | H05B 45/20 |
| | | | | 250/228 |
| 2008/0137331 | A1* | 6/2008 | Kaneko | G02B 19/0066 |
| | | | | 362/231 |
| 2008/0273141 | A1* | 11/2008 | Hsu | H01L 25/0753 |
| | | | | 349/62 |
| 2009/0091947 | A1* | 4/2009 | Chou | G02F 1/133603 |
| | | | | 362/612 |
| 2009/0278155 | A1* | 11/2009 | Inoguchi | H01L 25/0753 |
| | | | | 257/98 |
| 2010/0045154 | A1* | 2/2010 | Kim | H01L 27/153 |
| | | | | 313/1 |
| 2010/0081218 | A1* | 4/2010 | Hardin | H01L 33/508 |
| | | | | 438/7 |
| 2010/0085512 | A1* | 4/2010 | Ueda | G09G 3/3426 |
| | | | | 349/68 |
| 2010/0103660 | A1* | 4/2010 | van de Ven | H01L 25/0753 |
| | | | | 362/231 |
| 2010/0237780 | A1* | 9/2010 | Kim | H01L 25/167 |
| | | | | 315/52 |
| 2010/0320928 | A1* | 12/2010 | Kaihotsu | H01L 25/0753 |
| | | | | 315/250 |
| 2011/0001151 | A1* | 1/2011 | Le Toquin | H01L 33/44 |
| | | | | 257/98 |
| 2011/0175888 | A1* | 7/2011 | Joffer | G09G 3/2003 |
| | | | | 345/211 |
| 2011/0220920 | A1* | 9/2011 | Collins | H01L 33/504 |
| | | | | 257/88 |
| 2011/0227487 | A1* | 9/2011 | Nichol | G02B 6/0068 |
| | | | | 315/158 |
| 2012/0032196 | A1* | 2/2012 | Sato | H01L 25/0753 |
| | | | | 257/88 |
| 2012/0043563 | A1* | 2/2012 | Ibbetson | H01L 25/0753 |
| | | | | 257/88 |
| 2012/0061703 | A1* | 3/2012 | Kobayashi | H01L 24/97 |
| | | | | 257/98 |
| 2012/0068198 | A1* | 3/2012 | Andrews | H01L 33/62 |
| | | | | 257/88 |
| 2012/0092389 | A1* | 4/2012 | Okuyama | H04N 9/30 |
| | | | | 345/690 |
| 2012/0132937 | A1* | 5/2012 | Chan | H01L 25/0753 |
| | | | | 257/89 |
| 2012/0169786 | A1* | 7/2012 | Okuyama | H01L 33/54 |
| | | | | 345/690 |
| 2012/0199852 | A1* | 8/2012 | Lowes | G09F 9/3026 |
| | | | | 257/88 |
| 2012/0199860 | A1* | 8/2012 | Hodota | H01L 33/405 |
| | | | | 257/98 |
| 2012/0205675 | A1* | 8/2012 | Yamazaki | H01L 27/3202 |
| | | | | 257/88 |
| 2012/0223345 | A1* | 9/2012 | Tomoda | H01L 33/46 |
| | | | | 257/89 |
| 2013/0062649 | A1* | 3/2013 | Hata | H01L 33/501 |
| | | | | 257/98 |
| 2013/0105835 | A1* | 5/2013 | Wu | H01L 25/0753 |
| | | | | 257/89 |
| 2013/0264538 | A1* | 10/2013 | Oh | H01L 33/60 |
| | | | | 257/13 |
| 2013/0300285 | A1* | 11/2013 | Ito | H05B 33/02 |
| | | | | 313/512 |
| 2013/0328073 | A1* | 12/2013 | Lowes | H01L 33/54 |
| | | | | 257/89 |
| 2013/0328074 | A1* | 12/2013 | Lowes | H01L 33/54 |
| | | | | 257/89 |
| 2013/0329425 | A1* | 12/2013 | Lowes | H01L 33/504 |
| | | | | 362/235 |
| 2013/0329429 | A1* | 12/2013 | Lowes | F21K 9/62 |
| | | | | 362/247 |
| 2013/0334559 | A1* | 12/2013 | Vdovin | H01L 33/54 |
| | | | | 257/98 |
| 2013/0335975 | A1* | 12/2013 | Park | F21S 41/20 |
| | | | | 362/297 |
| 2014/0027795 | A1* | 1/2014 | Reiherzer | H01L 33/508 |
| | | | | 257/88 |
| 2014/0131748 | A1* | 5/2014 | Song | H01L 25/0753 |
| | | | | 257/89 |
| 2014/0246990 | A1* | 9/2014 | Kim | H05B 45/24 |
| | | | | 315/250 |
| 2014/0367713 | A1* | 12/2014 | Zhang | H01L 33/54 |
| | | | | 257/89 |
| 2015/0091787 | A1 | 4/2015 | Ohmae et al. | |
| 2015/0194580 | A1* | 7/2015 | Lowes | F21V 9/00 |
| | | | | 257/89 |
| 2016/0071442 | A1* | 3/2016 | Joffer | G09F 9/3026 |
| | | | | 348/802 |

FOREIGN PATENT DOCUMENTS

| | | |
|---|---|---|
| CN | 102655197 A | 9/2012 |
| JP | 2009-099715 A | 5/2009 |
| JP | 2012-182276 A | 9/2012 |
| TW | 200917458 A | 4/2009 |

OTHER PUBLICATIONS

Chinese Office Action dated Feb. 2, 2018 in connection with Chinese Application No. 201410494384.7, and English translation thereof.

* cited by examiner

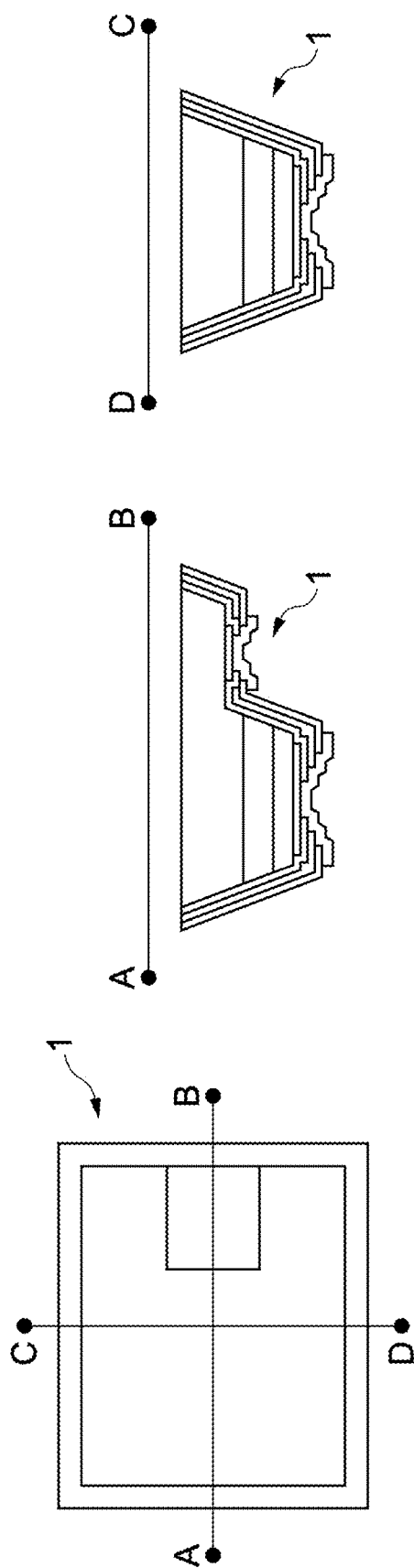
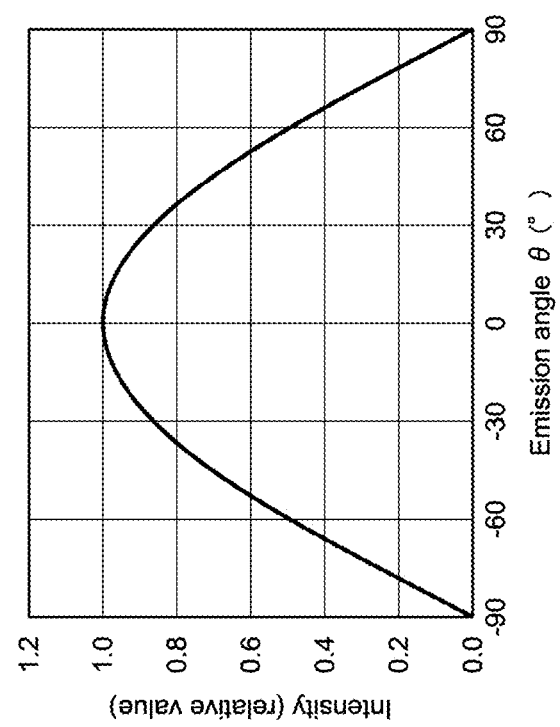
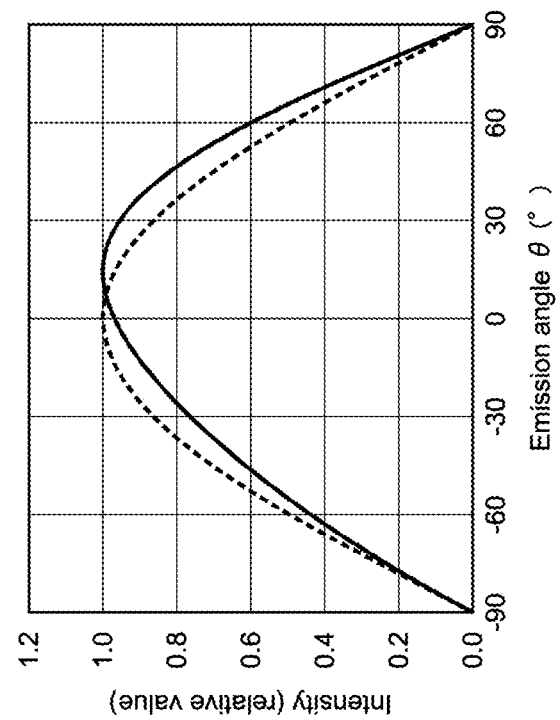
FIG.6

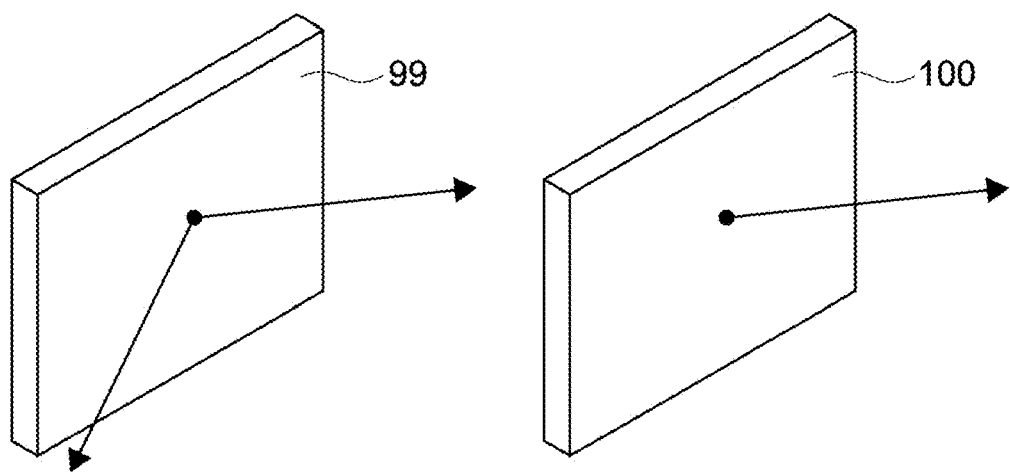
FIG.15
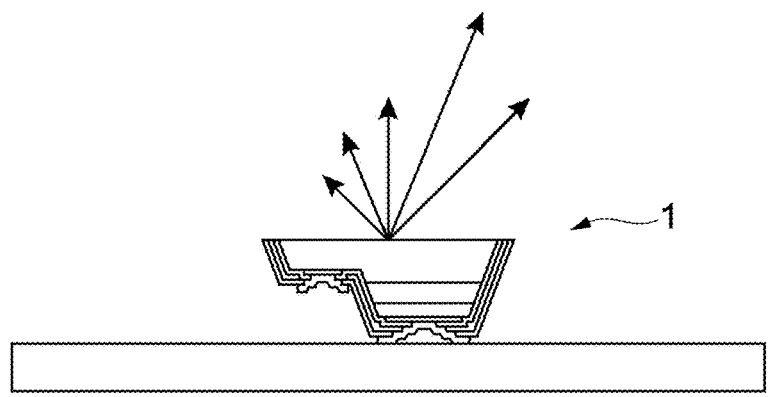
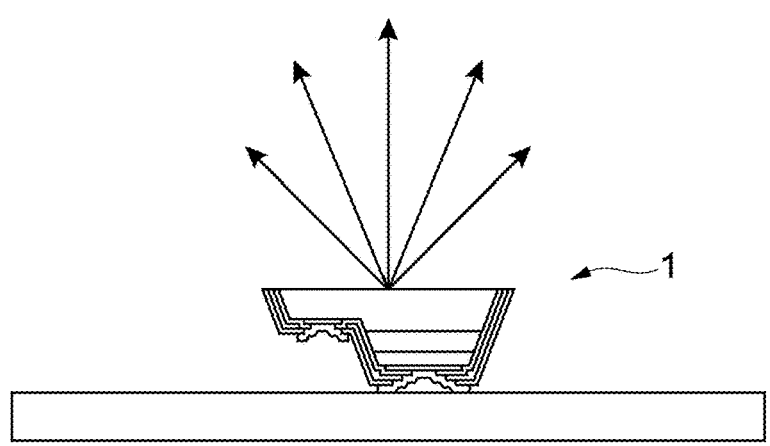
FIG.16

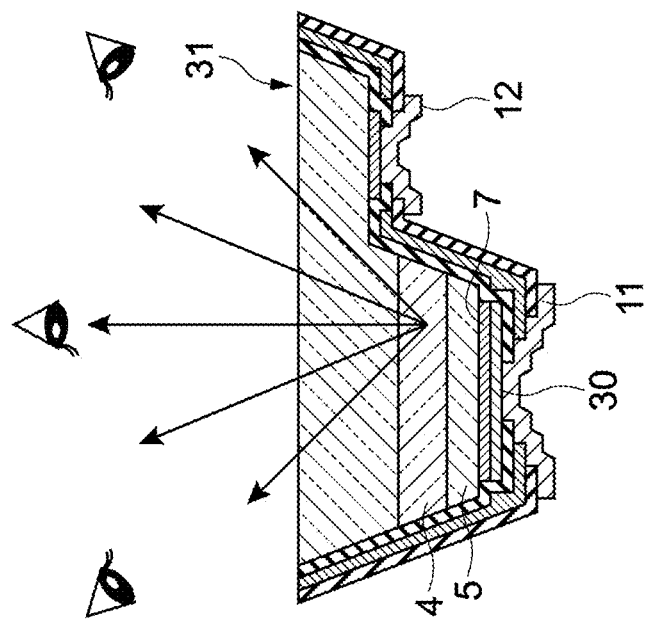
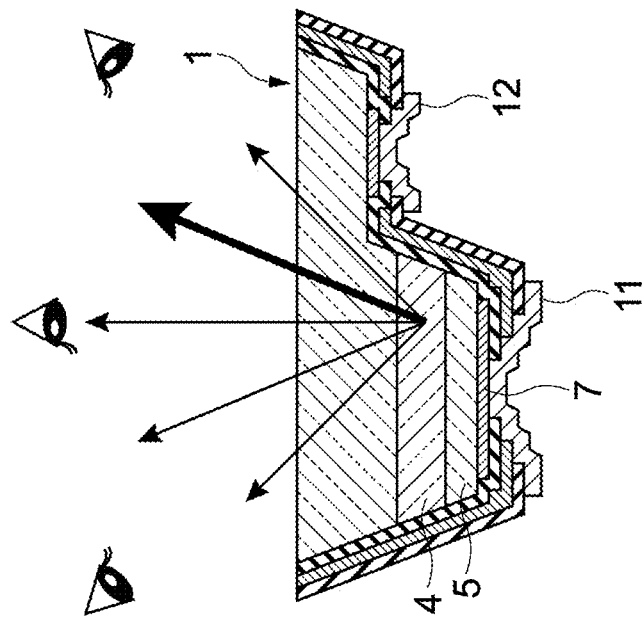
FIG.22

LIGHT EMITTING APPARATUS, LIGHT EMITTING UNIT, DISPLAY APPARATUS, ELECTRONIC DEVICE AND LIGHT EMITTING ELEMENT

CROSS REFERENCE TO RELATED APPLICATIONS

This application is a continuation of and claims the benefit under 35 U.S.C. § 120 of U.S. patent application Ser. No. 14/494,686, titled "LIGHT EMITTING APPARATUS, LIGHT EMITTING UNIT, DISPLAY APPARATUS, ELECTRONIC DEVICE AND LIGHT EMITTING ELEMENT," filed on Sep. 24, 2014, now U.S. Pat. No. 10,168,004, which claims the benefit of Japanese Priority Patent Applications JP 2013-206590, filed Oct. 1, 2013, and JP 2014-025755, filed Feb. 13, 2014, each of which is hereby incorporated herein by reference in its entirety.

BACKGROUND

The present disclosure relates to a light emitting apparatus, a light emitting unit, a display apparatus, an electronic device and a light emitting element using a plurality of point light sources.

SUMMARY

In recent years, an illumination apparatus or a display apparatus composed of a plurality of point light sources including light emitting diodes (LEDs) is widely used. A variety of improvements, e.g., an increase in a light emitting efficiency, have been made.

There is a self light emitting LED display provided by configuring a light emitting unit where point light sources, i.e., red, green and blue LEDs configure one pixel, and arranging a plurality of the light emitting units on a mounting substrate in order to provide a necessary resolution.

As an example of improving the light emitting unit of the self-light emitting LED display, side faces and bottom faces of the light emitting elements of the light emitting unit are covered with a laminate having an insulation layer and a metal layer to decrease an adverse effect (for example, resin having no blue light resistance) caused by light propagating the light emitting unit (see, for example, Japanese Patent Application Laid-open No. 2012-182276).

According to the technology, the above-described laminate is disposed on at least blue and green light emitting elements among three color light emitting elements in the light emitting unit, whereby the light emitted from these light emitting elements can inhibit a red light emitting element from exciting. Therefore, a change in color temperature of the light emitting unit or a decrease in a color reproduction range can be inhibited.

Also, there is disclosed a technology that, in a light emitting apparatus including a plurality of LED, heights of electrodes mounted on adjacent LED chips are changed and light emitted from side faces of the LED chips is prevented from absorbing to adjacent LED chips, thereby decreasing light loss through the light emitting apparatus (see, for example, Japanese Patent Application Laid-open No. 2009-99715).

For example, in the technology disclosed in Japanese Patent Application Laid-open No. 2009-99715, the light loss through the light emitting apparatus can be decreased, but light properties of the light emitting apparatus used as a display apparatus and an illumination apparatus cannot be improved. Therefore, in the light emitting element or the light emitting apparatus having a non-uniform light property, there are a variety of problems relating to the light properties, e.g., non-uniform color tone and brightness are generated depending on a user's position looking the emitted light.

In view of the circumstances as described above, there is a need for providing a light emitting apparatus, a light emitting unit, a display apparatus, an electronic device and a light emitting element having improved light properties.

According to an embodiment of the present disclosure, there is provided a light emitting apparatus, including a plurality of light emitting elements having biased light properties; and a mounting substrate where the light emitting elements are arranged such that the biased light properties are complemented within a group including at least two light emitting elements among a plurality of the light emitting elements.

The light emitting elements may be arranged such that biased intensity distributions in the light properties are faced to different directions within the group.

Total intensity distributions combined may be in a point symmetry within the group.

Each of the light emitting elements may have a semiconductor layer where a first conductive layer, an active layer and a second conductive layer are laminated, a first electrode layer electrically connected to the first conductive layer, a second electrode layer electrically connected to the second conductive layer; and the semiconductor layer, the first electrode layer and the second electrode layer are offset from a middle of each of the light emitting elements viewed from an upper face of each of the light emitting elements.

According to an embodiment of the present disclosure, there is provided a display apparatus, including a plurality of light emitting units each including one pixel configured of a plurality of light emitting elements having biased light properties and having different light emitting wavelengths each other; a mounting substrate where a plurality of the light emitting units are arranged such that the biased light properties are complemented within a group configured of the light emitting elements having the same wavelength and at least two light emitting units of a plurality of the light emitting units; and a driving circuit for driving the light emitting elements based on a video signal.

The light emitting units may include a first light emitting unit configured of a plurality of the light emitting elements arranged to have a biased intensity distribution in the light properties in a first direction; and a second light emitting unit configured of a plurality of the light emitting elements arranged to have a biased intensity distribution in the light properties in a second direction opposite to the first direction, and in which the first light emitting unit and the second light emitting unit are arranged alternately per block in a predetermined number of rows and columns on the mounting substrate.

The light emitting units may include a first light emitting unit where the light emitting elements are arranged such that the biased intensity distribution is in a first direction; and a second light emitting unit where the first light emitting unit is rotated for 180 degrees such that the biased intensity distribution is in a second direction opposite to the first direction; and in which the first light emitting unit and the second light emitting unit are arranged alternately per block in a predetermined number of rows and columns on the mounting substrate.

According to an embodiment of the present disclosure, there is provided an electronic device, including a display apparatus, including a plurality of light emitting units each including one pixel configured of a plurality of light emitting elements having biased light properties and having different light emitting wavelengths each other; a mounting substrate where a plurality of the light emitting units are arranged such that the biased light properties are complemented within a group configured of the light emitting elements having the same wavelength and at least two light emitting units of a plurality of the light emitting units; and a driving circuit for driving the light emitting elements based on a video signal, and a display control unit for sending the video signal to the display apparatus.

According to an embodiment of the present disclosure, there is provided a light emitting apparatus, including a light emitting element having a biased intensity distribution in a first direction and a uniform intensity distribution in a second direction orthogonal to the first direction; and a mounting substrate where a plurality of the light emitting elements are arranged along a surface of the mounting substrate in a predetermined direction as the second direction.

According to an embodiment of the present disclosure, there is provided a display apparatus, including a light emitting unit including one pixel configured of a plurality of light emitting elements each having a biased intensity distribution in a first direction and a uniform intensity distribution in a second direction orthogonal to the first direction and having different light emitting wavelengths each other; a mounting substrate where a plurality of the light emitting elements are arranged along a surface of the mounting substrate in a predetermined direction as the second direction; and a driving circuit for driving the light emitting elements based on a video signal.

According to an embodiment of the present disclosure, there is provided an electronic device, including a display apparatus, including a light emitting unit including one pixel configured of a plurality of light emitting elements each having a biased intensity distribution in a first direction and a uniform intensity distribution in a second direction orthogonal to the first direction and having different light emitting wavelengths each other; a mounting substrate where a plurality of the light emitting units are arranged such that the biased light properties are complemented within a group configured of the light emitting elements having the same wavelength and at least two light emitting units of a plurality of the light emitting units; and a driving circuit for driving the light emitting elements based on a video signal, and a display control unit for sending the video signal to the display apparatus.

According to an embodiment of the present disclosure, there is provided a light emitting unit, including a mounting substrate; a three or more light emitting elements arranged on the mounting substrate being arranged in first and second directions orthogonal to each other and biased each other in the second direction where a requested view angle in the first direction is higher than that in the second direction.

A displacement amount of the light emitting elements arranged and biased each other may be based on a size of the light emitting elements.

According to an embodiment of the present disclosure, there is provided a display apparatus, including a light emitting unit including a first mounting substrate, and one pixel configured of three or more light emitting elements arranged on the first mounting substrate being arranged in first and second directions orthogonal to each other where a requested view angle in the first direction is higher than that in the second direction and biased in the second direction; a second mounting substrate on which a plurality of the light emitting units are arranged; and a driving circuit for driving the light emitting elements based on a video signal.

According to an embodiment of the present disclosure, there is provided an electronic device, including a display apparatus, including a light emitting unit including, a first mounting substrate, and one pixel configured of three or more light emitting elements arranged on the first mounting substrate being arranged in first and second directions orthogonal to each other where a requested view angle in the first direction is higher than that in the second direction and biased in the second direction; a second mounting substrate on which a plurality of the light emitting units are arranged; and a driving circuit for driving the light emitting elements based on a video signal, and a display control unit for sending the video signal to the display apparatus.

According to an embodiment of the present disclosure, there is provided a light emitting element, including a semiconductor layer where a first conductive layer, an active layer and a second conductive layer are laminated, a first electrode layer electrically connected to the first conductive layer, a second electrode layer electrically connected to the second conductive layer; and a reflection layer formed in contacted with an opposite side of the first conductive layer of the first electrode, the semiconductor layer, the first electrode layer, the second electrode layer and the reflection layer being offset from a middle of the light emitting element viewed from an upper face of the light emitting element.

The reflection layer may have at least one of a plurality of combinations of predetermined areas and predetermined reflectances in order to provide the uniform intensity distribution of the light emitting element.

According to an embodiment of the present disclosure, there is provided a light emitting apparatus, including a light emitting element, including a semiconductor layer where a first conductive layer, an active layer and a second conductive layer are laminated, a first electrode layer electrically connected to the first conductive layer, a second electrode layer electrically connected to the second conductive layer; and a reflection layer formed in contacted with an opposite side of the first conductive layer of the first electrode, the semiconductor layer, the first electrode layer, the second electrode layer and the reflection layer being offset from a middle of the light emitting element viewed from an upper face of the light emitting element, and a mounting substrate on which a plurality of the light emitting elements.

According to an embodiment of the present disclosure, there is provided a display apparatus, including a light emitting unit including one pixel configured of a plurality of light emitting elements having different light emitting wavelengths each other, the light emitting elements each having a semiconductor layer where a first conductive layer, an active layer and a second conductive layer are laminated, a first electrode layer electrically connected to the first conductive layer, a second electrode layer electrically connected to the second conductive layer; a reflection layer formed in contacted with an opposite side of the first conductive layer of the first electrode, the semiconductor layer, the first electrode layer, the second electrode layer and the reflection layer being offset from a middle of each of the light emitting elements viewed from an upper face of each of the light emitting elements; a mounting substrate on which a plurality of the light emitting units are arranged; and a driving circuit for driving the light emitting elements based on a video signal.

According to an embodiment of the present disclosure, there is provided an electronic device, including a display apparatus, including a light emitting unit including one pixel configured of a plurality of light emitting elements having different light emitting wavelengths each other, the light emitting elements each having a semiconductor layer where a first conductive layer, an active layer and a second conductive layer are laminated, a first electrode layer electrically connected to the first conductive layer, a second electrode layer electrically connected to the second conductive layer, and a reflection layer formed in contacted with an opposite side of the first conductive layer of the first electrode, the semiconductor layer, the first electrode layer, the second electrode layer and the reflection layer being offset from a middle of each of the light emitting elements viewed from an upper face of each of the light emitting elements, a mounting substrate on which a plurality of the light emitting units are arranged, a driving circuit for driving the light emitting elements based on a video signal, and a display control unit for sending the video signal to the display apparatus.

As described above, according to embodiments of the present disclosure, light properties of a light emitting apparatus, a light emitting unit, a display apparatus, an electronic device and a light emitting element can be improved.

Advantages described herein are not necessarily limited. Any of the advantages described in the present disclosure may be provided.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 6 shows results of an intensity distribution of light emission of the light emitting elements measured in two directions;

FIG. 15 shows a difference between a display apparatus not according to an embodiment of the present disclosure and the display apparatus according to an embodiment of the present disclosure in an inspection process;

FIG. 16 shows the light emitting element having a great biased intensity distribution and the light emitting element having a minute biased intensity distribution;

FIG. 22 shows the light emitting element having the biased intensity distribution and the light emitting element having the uniform intensity distribution;

DETAILED DESCRIPTION OF EMBODIMENTS

Hereinafter, an embodiment of the present disclosure will be described with reference to the drawings. In the following, as a point light source, there is used an LED chip having a flip-chip structure (a face-down structure) where a laminate having a metal layer and an insulation layer is disposed at side faces and a bottom faces. However, embodiments of the present disclosure are applied not only to the LED chip, but also to LED chips having no laminate, having a top-emitting structure (a face-up structure) and an inverse pyramid style structure (a truncated inverted pyramid structure). Also, the embodiments of the present disclosure are applicable to point light sources other than the LED.

First Embodiment

According to a first embodiment, light emitting elements having a biased light emission intensity distribution (also referred to as a light emission distribution or a light distribution property) are used. A light emitting apparatus using a plurality of the light emitting elements to decrease bias of the intensity distribution by elaborating arrangement directions and positions of the light emitting elements will be described.

Among the light emitting apparatuses, a display apparatus used for showing image information to a user may be used as a display connected to a personal computer, or may be used as an electronic device where the display apparatus and a display control circuit for driving and controlling the display apparatus are incorporated.

In the following, firstly, a structural example of the light emitting element will be described. Next, the intensity distribution of the light emitting element will be described. Lastly, an arrangement of each light emitting element in order to provide a uniform intensity distribution over a light emitting apparatus as a whole will be described.

[Structure of Light Emitting Element]

Figure 1:
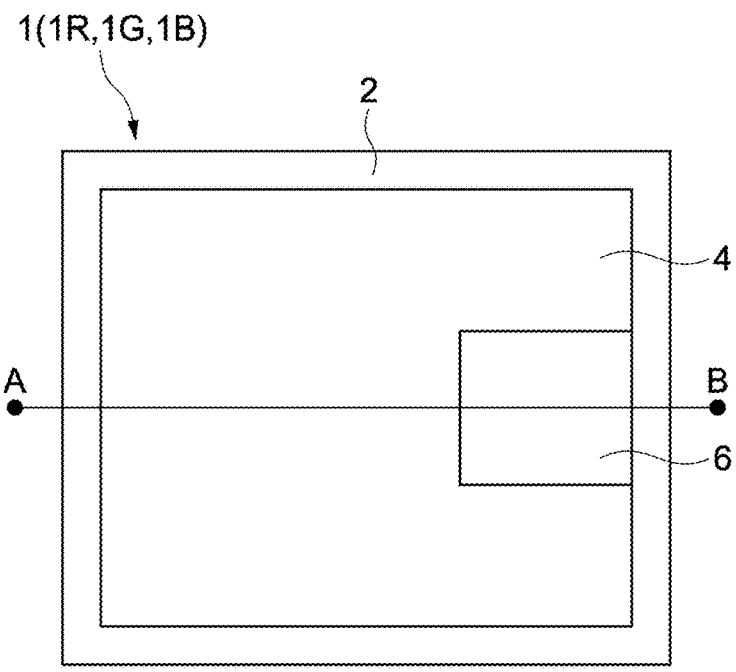
FIG. 1 is a top view of an illustrative light emitting element.

FIG. 1 is a top view of a light emitting element 1 used as an example of the light emitting element in the following description. The light emitting element 1 is the LED chip having a flip-chip structure as described above. In the description, when the color of each LED is not an issue, it expresses as the light emitting element 1, and when respective LEDs in red (R), green (G) and blue (B) in color are distinguished, it expresses as a light emitting element 1R, a light emitting element 1G and a light emitting element 1B.

As shown in FIG. 1, the light emitting element 1 has a laminate 2 therearound. Inside of the laminate 2, there is a second conductive layer which is transparent. Because of transparency, an active layer 4 and a second electrode 6 (a second electrode layer) located below can be seen. The second conductive layer, the active layer 4 and the second electrode 6 will be described below.

A first electrode 7 (a first electrode layer) occupies only a part of a right end of the light emitting element 1 narrower than the active layer 4. A flat surface shape of the LED chip has an almost square shape, for example.

Figure 2:
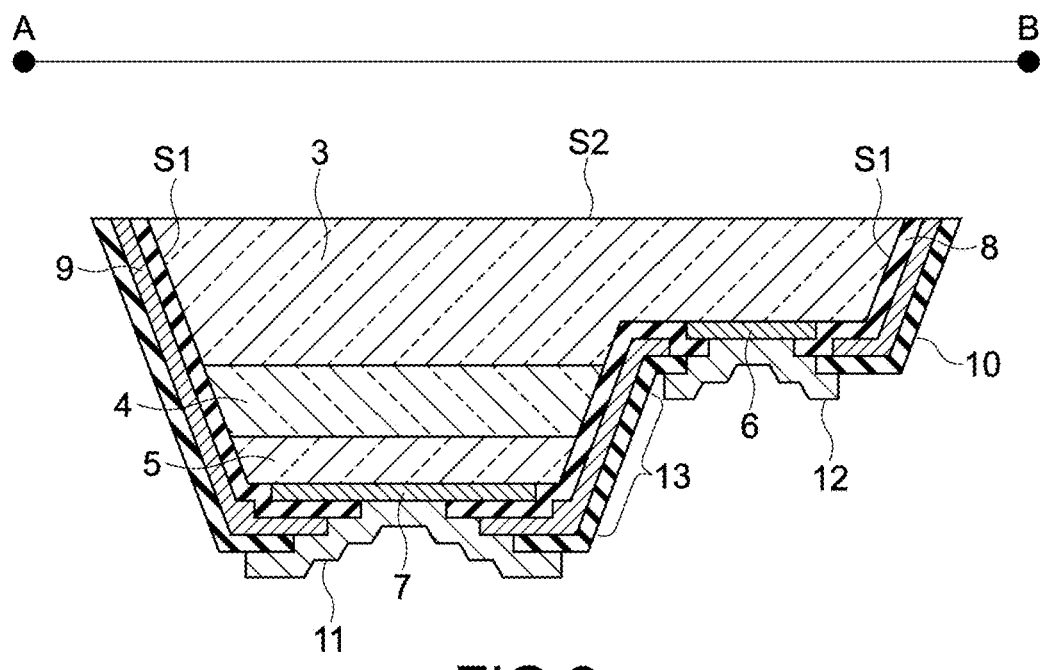
FIG. 2 is a cross-sectional view of the light emitting element in FIG. 1 along an A-B line.

FIG. 2 is a cross-sectional view of the light emitting element 1 in FIG. 1 along an A-B line. The light emitting element 1 is a solid light emitting element for emitting light in a predetermined wavelength band, and is specifically an LED chip. The LED chip herein is cut from a wafer used in crystal growth, and is not a package type covered with a molded resin.

The LED chip has a size of from 5 μm to 100 mm, for example, and includes a so-called micro LED. The LED chip has a flake shape and an aspect ratio (height/width) of 0.1 to less than 1, for example.

The light emitting element 1 has a semiconductor layer where the first conductive layer 5, the active layer 4 and the second conductive layer 3 are laminated sequentially. In the light emitting element 1G or 1B, the first conductive layer 5, the active layer 4 and the second conductive layer 3 are composed of an InGaN based semiconductor material. In the light emitting element 1R, the first conductive layer 5, the active layer 4 and the second conductive layer 3 are composed of an AlGaInP based semiconductor material.

In the semiconductor layer of the light emitting element 1, a part of the second conductive layer 3, the active layer 4 and the first conductive layer 5 have a columnar mesa portion 13. At a base of the mesa portion 13 in the semiconductor layer, a flat surface where the second conductive layer 3 is exposed is spread. On a part of the flat surface, the second electrode 6 is formed.

The second electrode 6 is a metal electrode. In the light emitting element 1G or 1B, the second electrode 6 is composed of Ti/Pt/Au. In the light emitting element 1R, the second electrode 6 is composed of AuGe/Ni/Au. The second electrode 6 is in contact with the second conductive layer 3 and is electrically connected to the second conductive layer 3. In other words, the second electrode 6 is in an ohmic contact with the second conductive layer 3.

An upper face of the second conductive layer 3 (i.e., a face opposite to the mesa portion 13 of the semiconductor layer) forms a light extraction face S2, and no light shielding structure such as an electrode is disposed. At a lower face of the mesa portion 13 (i.e., a surface of the first conductive layer 5), the first electrode 7 is formed.

The first electrode 7 is a metal electrode. In the light emitting element 1G or 1B, the first electrode 7 is composed of Ti/Pt/Au. In the light emitting element 1R, the first electrode 7 is composed of AuGe/Ni/Au. The first electrode 7 is in contact with the first conductive layer 5 and is electrically connected to the first conductive layer 5. In other words, the first electrode 7 is in an ohmic contact with the first conductive layer 5. Any of the first electrode 7 and the second electrode 6 may be configured of a single electrode or may be configured of a plurality of electrodes.

A side face S1 of the mesa portion 13 has a slope intersect with a lamination direction of the semiconductor layer. Specifically, the slope is provided such that a cross-section of the mesa portion 13 has an inverted trapezoid. In this manner, as the side face S1 is tapered, a light extraction efficiency in a front direction can be increased.

The light emitting element 1 has a laminate 2 having a first insulation layer 8, a metal layer 9 and a second insulation layer 10. The laminate 2 is formed from the side face S1 of the mesa portion 13 to the bottom faces. Each of the first insulation layer 8, the metal layer 9 and the second insulation layer 10 is a thin layer, and is formed by a thin film forming process such as CVD, vapor deposition and sputtering, for example. In other words, each of the first insulation layer 8, the metal layer 9 and the second insulation layer 10 is not formed by a thick film forming process such as a spin coat, a resin molding process, a potting process etc.

Each of the first insulation layer 8, the metal layer 9 and the second insulation layer 10 entirely covers at least the side face S1, and is formed from an opposing area to the side face S1 to a part of an opposing area to the first electrode 7. The first insulation layer 8 is for electrically insulating from the metal layer 9 and the semiconductor layer.

The first insulation layer 8 is formed from an end of the mesa portion 13 at a base side to an outer edge of the surface of the first electrode 7. In other words, the first insulation layer 8 is formed in contact with entire side face S1 and also in contact with the outer edge of the surface of the first electrode 7.

The first insulation layer 8 is composed of a material transparent to light emitted from the active layer 4, e.g., $SiO_2$, SiN, $Al_2O_3$, $TiO_2$ and TiN. The first insulation layer 8 has a uniform thickness of about 0.1 μm to 1 μm. But, the first insulation layer 8 may have non-uniform thickness due to a production error.

The metal layer 9 is for blocking or reflecting light emitted from the active layer 4. The metal layer 9 is formed in contact with the surface of the first insulation layer 8. The metal layer 9 is formed from an end at a light extraction face S2 side to a position a little receded from the end at a first electrode 7 side.

The end of the metal layer 9 at the light extraction face S2 side is formed on the end of the first insulation layer 8 at the light extraction face S2 side. On the other hand, the end of the metal layer 9 at the first electrode 7 side is formed at an opposing area to the first electrode 7, and is partly overlapped with the metal layer 9 via the first insulation layer 8. In other words, the metal layer 9 is (electrically) insulated and isolated from the semiconductor layer, the first electrode 7 and the second electrode 6 by the first insulation layer 8.

The metal layer 9 is composed of a material for blocking or reflecting light emitted from the active layer 4, e.g., Ti, Al, Cu, Au, Ni or an alloy thereof. The metal layer 9 has a uniform thickness of about 0.1 μm to 1 μm. But, the metal layer 9 may have non-uniform thickness due to a production error.

The second insulation layer 10 is for inhibiting short circuit between the metal layer 9 and the conductive material (for example, solder, plating, sputter metal) for adhering the pad electrodes 11, 12 with the mounting substrate, when the light emitting unit is mounted on the mounting substrate (not shown).

The second insulation layer 10 is formed in contact with the surface of the metal layer 9 and the surface of the first insulation layer 8. The metal layer 9 is covered with the first insulation layer 8 and the second insulation layer 10.

The second insulation layer 10 is composed of $SiO_2$, SiN, $Al_2O_3$, $TiO_2$, TiN etc. In addition, the second insulation layer 10 may be formed of a plurality of the above-described materials.

The second insulation layer 10 has a uniform thickness of about 0.1 μm to 1 μm, for example. But, the second insulation layer 10 may have non-uniform thickness due to a production error.

A pad electrode 11 is an electrode extracted from the first electrode 7 (i.e., an extraction electrode). The pad electrode 11 is formed at least at an opposing area to the first electrode 7. Specifically, the pad electrode 11 is formed at areas including the opposing area to the first electrode 7 and the opposing area to the end of the metal layer 9 at the first electrode 7 side. In other words, a part of the pad electrode 11 is overlapped with a part of the metal layer 9 via the second insulation layer 10.

A pad electrode 12 is an electrode extracted from the second electrode 6. The pad electrode 12 is formed at least at an opposing area of the second electrode 6.

Thus, in the light emitting element 1 used in the first embodiment, the semiconductor layer, the first electrode 7 and the second electrode 6 are offset from a middle of the light emitting element 1 viewed from an upper face of the light emitting element 1.

(Cause of Biased Intensity Distribution)

By a bias of the active layer 4, the light emitting element 1 has the biased intensity distribution. In other words, a single-sided electrode such as the light emitting element 1 has a greatly biased intensity distribution, as a VIA opening has a large area to a total area of the element viewed from the upper face when the second electrode 6 is formed.

In an LED chip having a double-sided electrode structure, the active layer has no bias. However, as a surface wiring is necessary, the intensity distribution is biased due to the surface wiring. Also, in the LED chip having such a type, by a production limit of the surface wiring in the production process, as the element is smaller, an area occupied by the surface wiring may be increased and the intensity distribution may be greatly biased.

Figure 3:
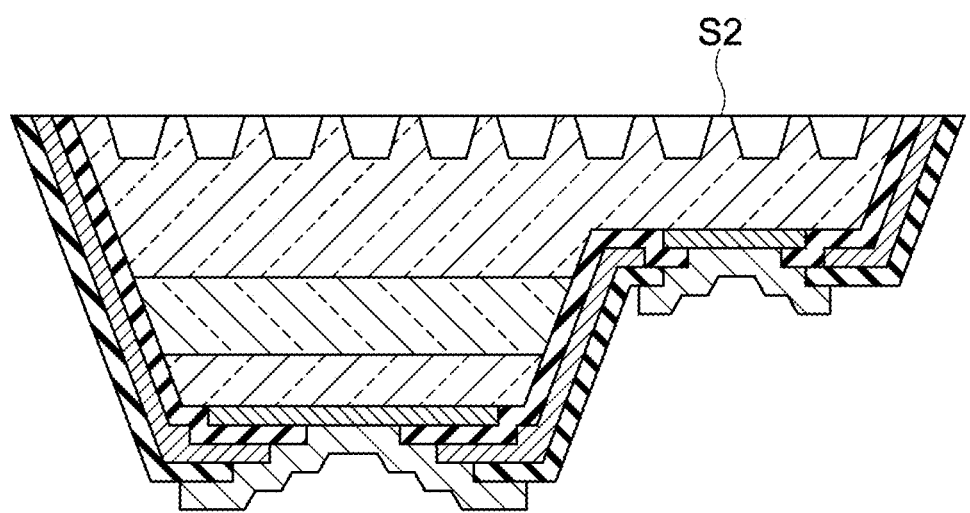
FIG. 3 shows an alternative embodiment where a special processing is applied to a light extracting surface of the light emitting element in order to improve light properties.

Alternative Embodiment 1: Special Processing of Surface of Light Emitting Element In order to improve the light properties, a special processing can be applied to the light extracting surface S2 of the light emitting element 1. FIG. 3 shows an alternative embodiment where the special processing is applied to the light extracting surface 2 of the light emitting element 1 in order to improve the light properties. As shown in FIG. 3, the light extracting surface 2 is not formed flat but formed to have a concavoconvex surface, whereby directions of light emitted from the second conductive layer 3 can be varied and the intensity distribution of the light emitting element can be further uniform.

The above description is about the structure of the light emitting element 1.

[Intensity Distribution of Light Emitting Element 1]

Figure 4:
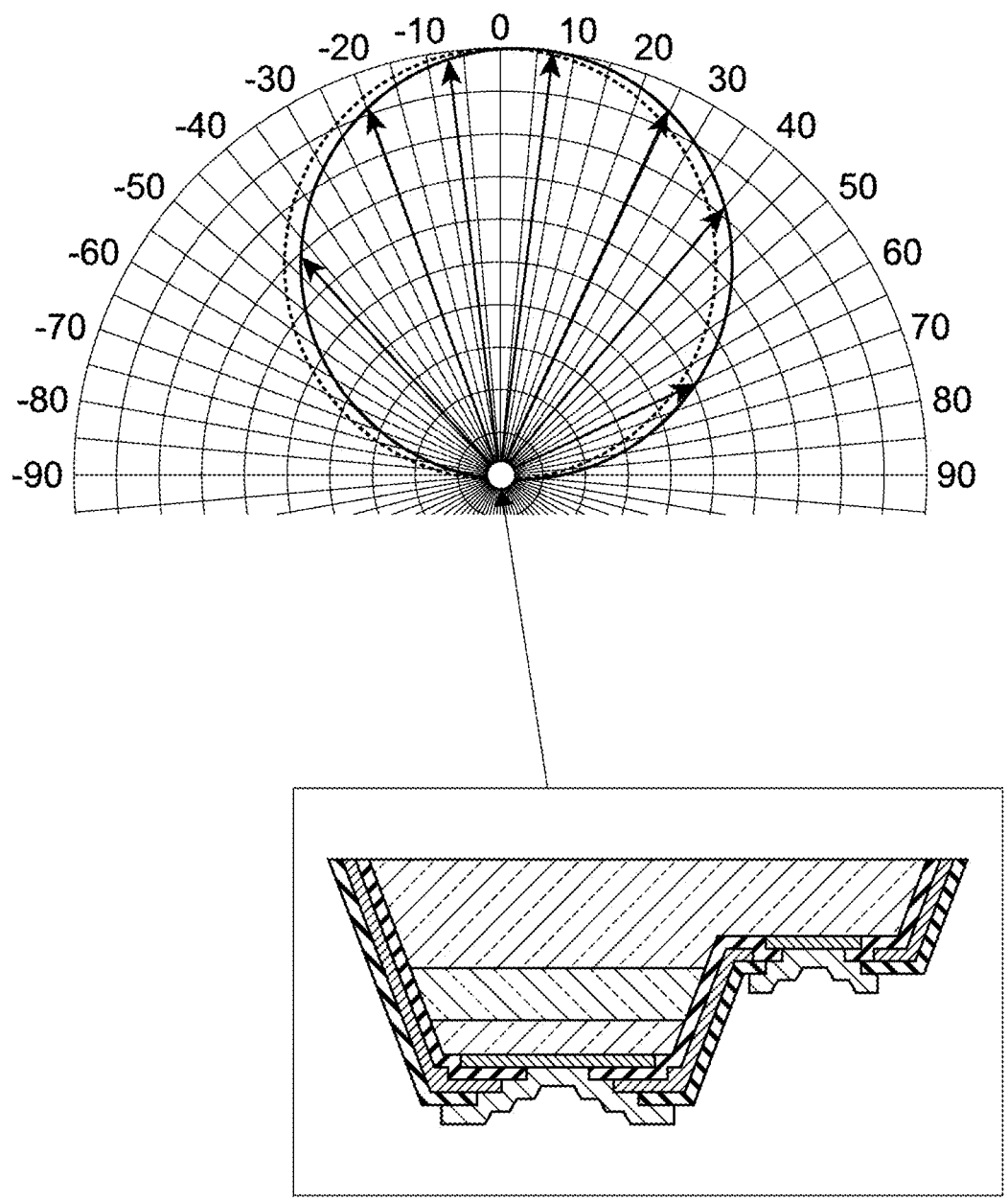
FIG. 4 is a graph showing an intensity distribution of light emission of the light emitting element in an FFP (Far Field Pattern) of a polar coordinate system.

Next, the intensity distribution of the light emitting element 1 will be described. FIG. 4 is a graph showing the intensity distribution of the light emitting element 1 in an FFP (Far Field Pattern) of a polar coordinate system. When the intensity distribution of the light emitting element 1 is measured by disposing the second electrode 6 of the light emitting element 1 at a right side, a measure result is somewhat near to the right side as compared to an entirely uniform intensity distribution shown by a dotted line in the graph, as shown in a lower side of the graph.

For example, light intensity of the light emitting element 1 at an "angle from the point light source" of 50 degrees (0 degree is set to directly above the light emitting element 1) is about 5% to 10% higher than that in the entirely uniform intensity distribution. At the angle of −50 degrees, the light intensity is about 5% to 10% lower than that in the entirely uniform intensity distribution.

Figure 5:
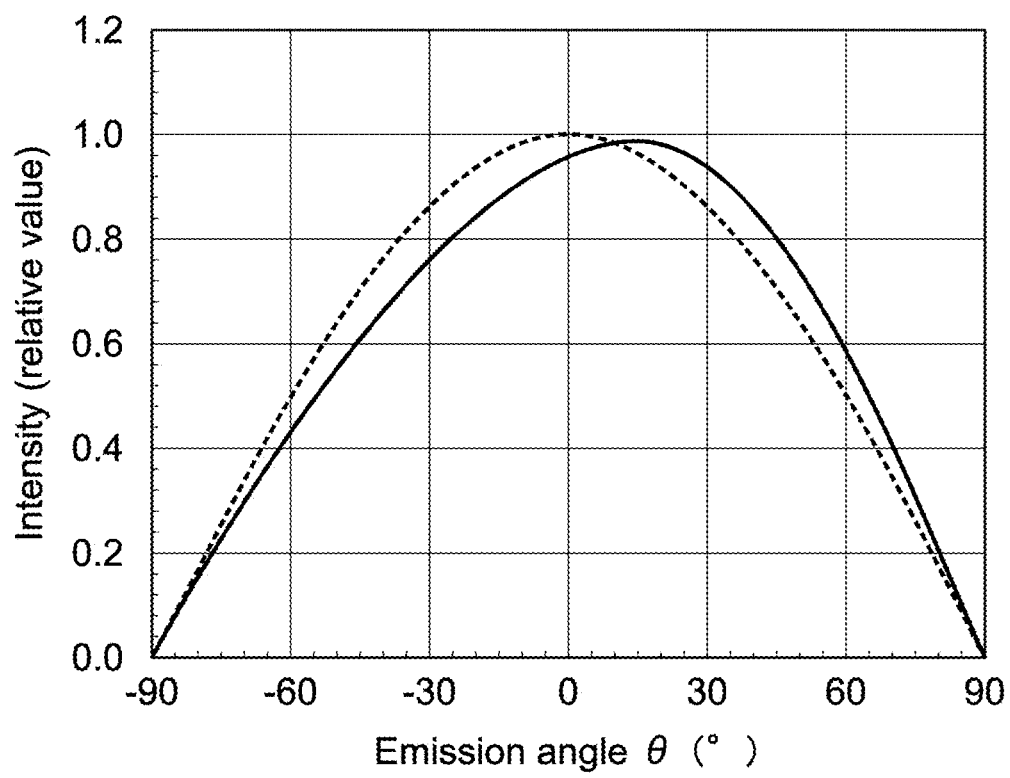
FIG. 5 is a graph showing an intensity distribution of light emission of the light emitting elements in an FFP of an orthogonal coordinate system.

FIG. 5 is a graph showing the intensity distribution of the light emitting element 1 in an FFP of an orthogonal coordinate system. Also this graph reveals that, when the intensity distribution of the light emitting element 1 is measured by disposing the second electrode 6 of the light emitting element 1 at a right side, a higher intensity distribution of the light emitting element 1 is somewhat near to the right side.

Next, when the intensity distribution of the light emitting element 1 is measured in a two dimensional fashion, a measured result will be described. FIG. 6 shows results of the intensity distribution of the light emitting element 1 measured in two directions.

An upper left view is a top view of the light emitting element 1, and shows positions of an A-B cross section including the second electrode 6 and a C-D cross section including no second electrode 6. An upper middle view is a cross-sectional view of the A-B cross section of the light emitting element 1, and shows a left-right asymmetry view where the second electrode 6 is arranged at a right side. An upper right view is a cross-sectional view of the C-D cross section of the light emitting element 1, and shows a left-right asymmetry view.

Lower left and right graphs show measured results of the intensity distribution of the light emitting element 1 in A-B and C-D cross sectional directions, respectively. An emission angle θ in a direction directly above the light emitting element 1 is defined as 0 degree. The light intensity is represented by a relative angle to the intensity in the direction directly above the light emitting element 1.

As seen from the lower left graph, in the A-B direction, the light intensity at a B (right, the emission angle is positive) side is greater than that at an A (left, the emission angle is negative) side. A dotted line shown in the graph represents the intensity suppose that the light intensity has left-right symmetry. As seen from the lower right graph, in the C-D direction, the light intensity at a C (right, the emission angle is positive) side is the same as that at a D (left, the emission angle is negative) side.

As described above, the light emitting element 1 where the second electrode 6 is arranged at the right side is left-right asymmetry as shown in the upper left view, and the intensity distribution is biased to the right side (to a second electrode 6 side). In contrast, the light emitting element 1 has a line symmetry shape in a vertical direction, and the intensity distribution has no offset in the vertical direction.

The above description is about the intensity distribution of the light emitting element 1.

[Configuration of Display Apparatus]

Figure 7:
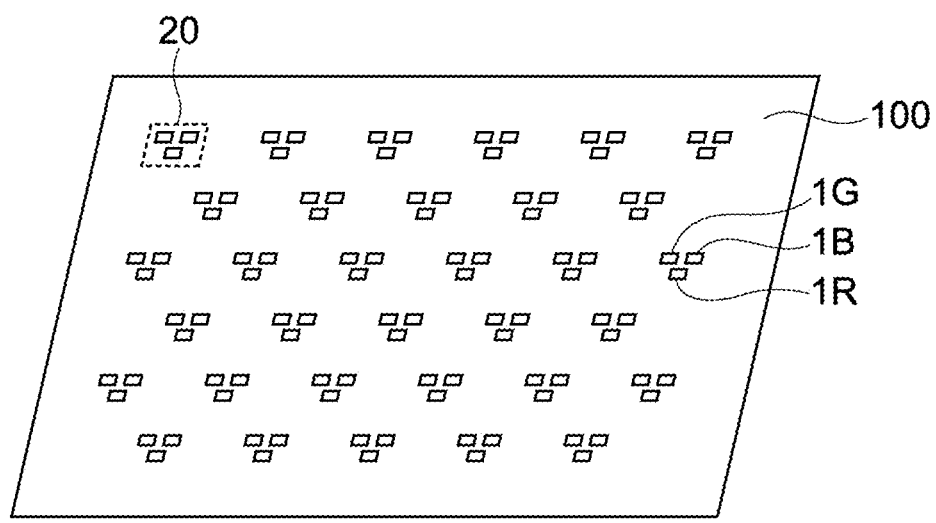
FIG. 7 shows an embodiment of a display apparatus using the light emitting elements.

Next, a configuration of a display apparatus using a plurality of the above-described light emitting elements 1 will be described. FIG. 7 shows an embodiment of a display apparatus 100 using the light emitting element 1R, the light emitting element 1G and the light emitting element 1B. The display apparatus 100 is configured of a display panel where a plurality of the light emitting elements 1R, 1G and 1B are arranged on the mounting substrate, and a driving circuit for individually driving the respective light emitting elements on the display panel.

As shown in FIG. 7, on the mounting substrate of the display apparatus 100, light emitting units 20 including the light emitting elements 1R (red), 1G (green) and 1B (blue) as one pixel are arranged as one unit in vertical and horizontal directions, respectively.

For example, when the display apparatus 100 has a full HD (High Definition) resolution, 1920 light emitting units 20 are arranged in the horizontal direction and 1080 light emitting units 20 are arranged in the vertical direction. When the light emitting unit 20 including one pixel has three (e.g., red, green and blue) light emitting elements 1, the driving control circuit of the display apparatus 100 will drive a total of 6 millions light emitting elements 1.

The display apparatus 100 is driven by a video signal. An electronic device using the display apparatus 100, e.g., a television receiver (see FIG. 13) has a display control unit for transmitting the video signal for driving the display apparatus 100 to the display apparatus 100.

The above description is about the structure of the display apparatus 100 using a plurality of the light emitting elements 1 is described.

[Mechanism for Obtaining Uniform Intensity Distribution]

Figure 8:
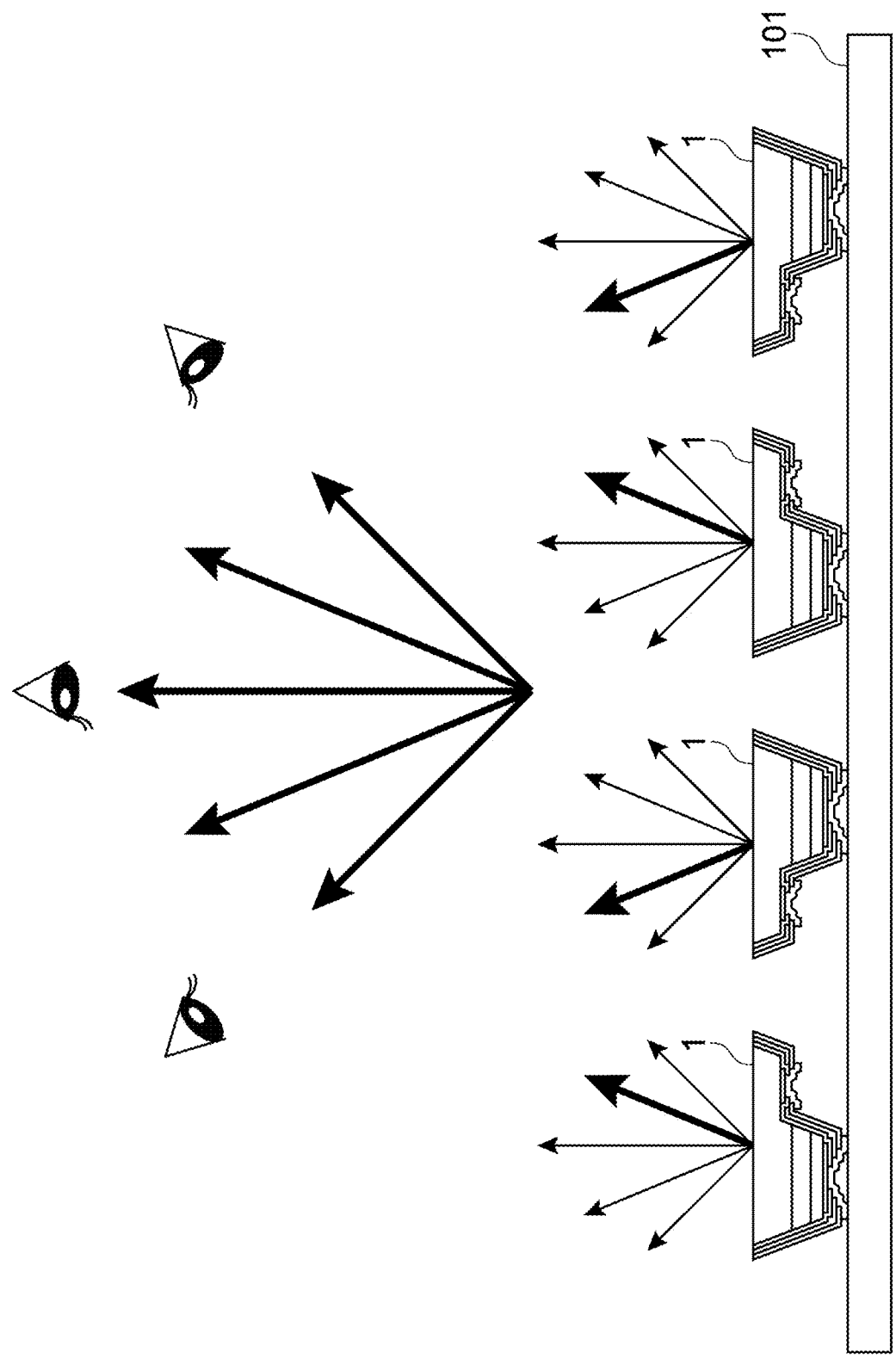
FIG. 8 illustrates a mechanism for obtaining a uniform intensity distribution over a light emitting apparatus as a whole using a plurality of light emitting elements having a biased intensity distribution.

Next, using a plurality of the light emitting elements 1 having a biased intensity distribution to predetermined directions, a mechanism for obtaining uniform intensity distribution within the group configured by a plurality of (at least two) light emitting elements 1 or over the light emitting apparatus as a whole will be described. FIG. 8 illustrates the mechanism for obtaining a uniform intensity distribution within a plurality of (at least two) the light emitting elements 1 or over the light emitting apparatus as a whole using a plurality of light emitting elements 1 having the biased intensity distribution.

As shown in FIG. 8, in the light emitting elements 1 disposed on the mounting substrate 101 of the display apparatus 100, the second electrodes 6 are disposed at a right side, a left side, a right side and left side from the left to the right. Accordingly, the light intensities emitted from the light emitting elements 1 are high at the right side, at the left side, at the right side and the left side from the left to the right. The light intensities emitted from the respective light emitting elements 1 are represented by line widths of arrows.

Like this, the intensity distributions of the respective light emitting elements 1 are biased. However, the biased directions are complemented in the respective directions in terms of the group configured by a predetermined number of (at least two) light emitting elements 1 or the group configured by a predetermined number of (at least two) light emitting units 20. Thus, it can be seen that the group as whole and the display apparatus as a whole have the uniform light intensity and the uniform intensity distribution, as shown by the arrows at upper side of FIG. 8.

Herein, the term "complement" involves not only complementing the biased intensity distribution as described above, but also complementing biased light wavelengths.

Complementing the biased light wavelengths is to inhibit biased colors so that an intended color of light is provided in the group configured by a predetermined number of (at least two) light emitting elements or the group configured by a predetermined number of (at least two) light emitting units. Specifically, the light emitting elements 1 or the light emitting units 20 having adjusted light emitting wavelengths are used to inhibit the biased colors.

In FIG. 8, one group is configured by the two of the light emitting element 1 at a left end and the light emitting element 1 adjacent to the right side thereof. Within the group, the biased intensity distribution is complemented, whereby total intensity distributions combined are in a point symmetry and the intensity distribution is thus uniform.

In other words, the display apparatus 100 (light emitting device) comprises a plurality of light emitting elements having the biased intensity distribution, and the mounting substrate on which the light emitting elements are arranged such that the biased distribution within the group configured by a plurality of the light emitting element is complemented.

Herein, each intended light emitting element 1 has one color, i.e., only red, only green or only blue. When the intensity distribution of the display apparatus 100 is uniformized as a whole in relation to each color of red, green or blue, the direction to arrange each light emitting element 1 in terms of each color should be considered, as described above.

In the above description, the biased intensity distribution is complemented using the light emitting elements 1 having the same color adjacent by directing the second electrode 6 to the right side in each odd-numbered light emitting element 1 from the left side, and by directing the second electrode 6 to the left side in each even-numbered light emitting element 1 from the left side. However, it is only an illustrative example. As long as the deviated intensity distribution is complemented over the light emitting apparatus as a whole to provide the uniform intensity distribution, arrangement directions may be random, and any light emitting element 1 may be arranged in any direction.

A specific method of arranging the light emitting elements 1 will be described below. The above description is about the mechanism for obtaining uniform intensity distribution.

[Specific Arrangement 1 of Light Emitting Elements 1]

Figure 9:
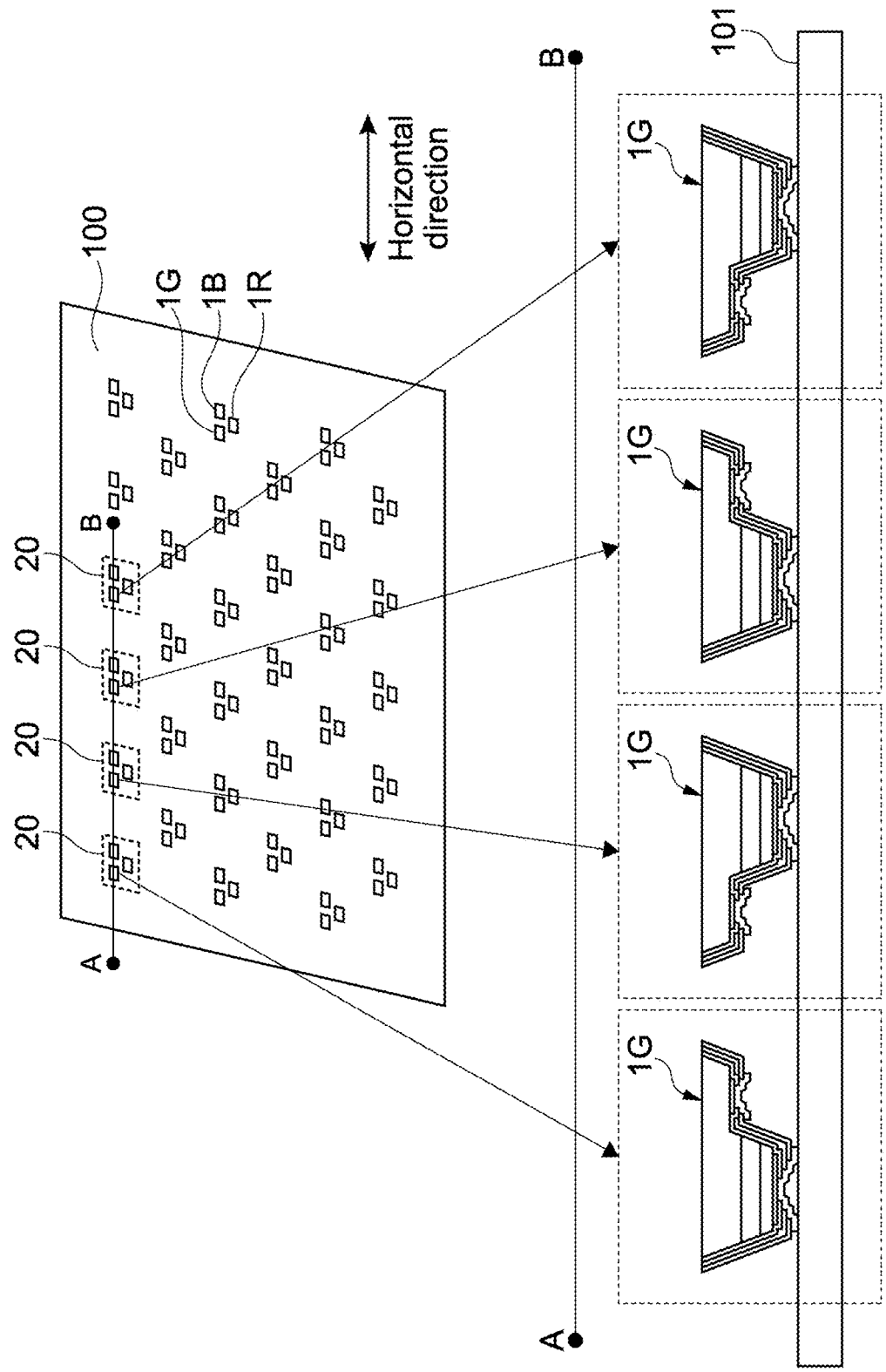
FIG. 9 shows a specific embodiment of a method of arranging the light emitting elements on a mounting substrate of a display apparatus.

Next, a specific method of arranging the light emitting elements 1 on the mounting substrate 101 of the display apparatus 100 will be described. FIG. 9 shows a specific embodiment of a method of arranging the light emitting elements 1 on the mounting substrate 101 of the display apparatus 100.

In the present specification, it shows that the light emitting elements 1 are directly disposed on a mounting substrate 101 (a second mounting substrate) of the display apparatus 1. However, in practice, the light emitting elements 1 having the respective colors may be together mounted on the substrate (the first mounting substrate) of each light emitting unit 20, and the light emitting units 20 may be arranged on the mounting substrate 101 of the display apparatus 100. Alternatively, a plurality of the light emitting elements 1 having the same color (for example, white LEDs) may be together mounted on each light emitting unit, and the light emitting units may be arranged on a mounting stage of the illumination apparatus.

As shown in FIG. 9, in each light emission unit 20 in a row at a left end of the uppermost column on the display apparatus 100, the light emitting element 1 in a green color included in the light emitting unit 20 is arranged such that the second electrode 6 is at a right side. In the light emission unit 20 in a second row from the left of the uppermost column on the display apparatus 100, the light emitting element 1G in a green color is arranged such that the second electrode 6 is at a left side.

In this manner, in each pixel (of the light emitting unit 20), one type of the light emitting elements 1 are arranged alternately per pixel (such that the second electrodes 6 are arranged in opposite directions each other), whereby it is possible to provide the uniform intensity distribution over the light emitting apparatus as a whole within the group including a plurality of light emitting elements.

It goes without saying that, when the intensity distribution is uniformized for red and blue colors in addition to green color, the light emitting elements 1R and 1B may be arranged independently similar to the light emitting element 1G.

In specific embodiments above and below, a plurality types of light emitting units are arranged alternately per block in a predetermined number of rows and columns.

The above description is about the specific method of arranging the light emitting elements 1.

[Specific Arrangement 2 of Light Emitting Elements 1]

Figure 10:
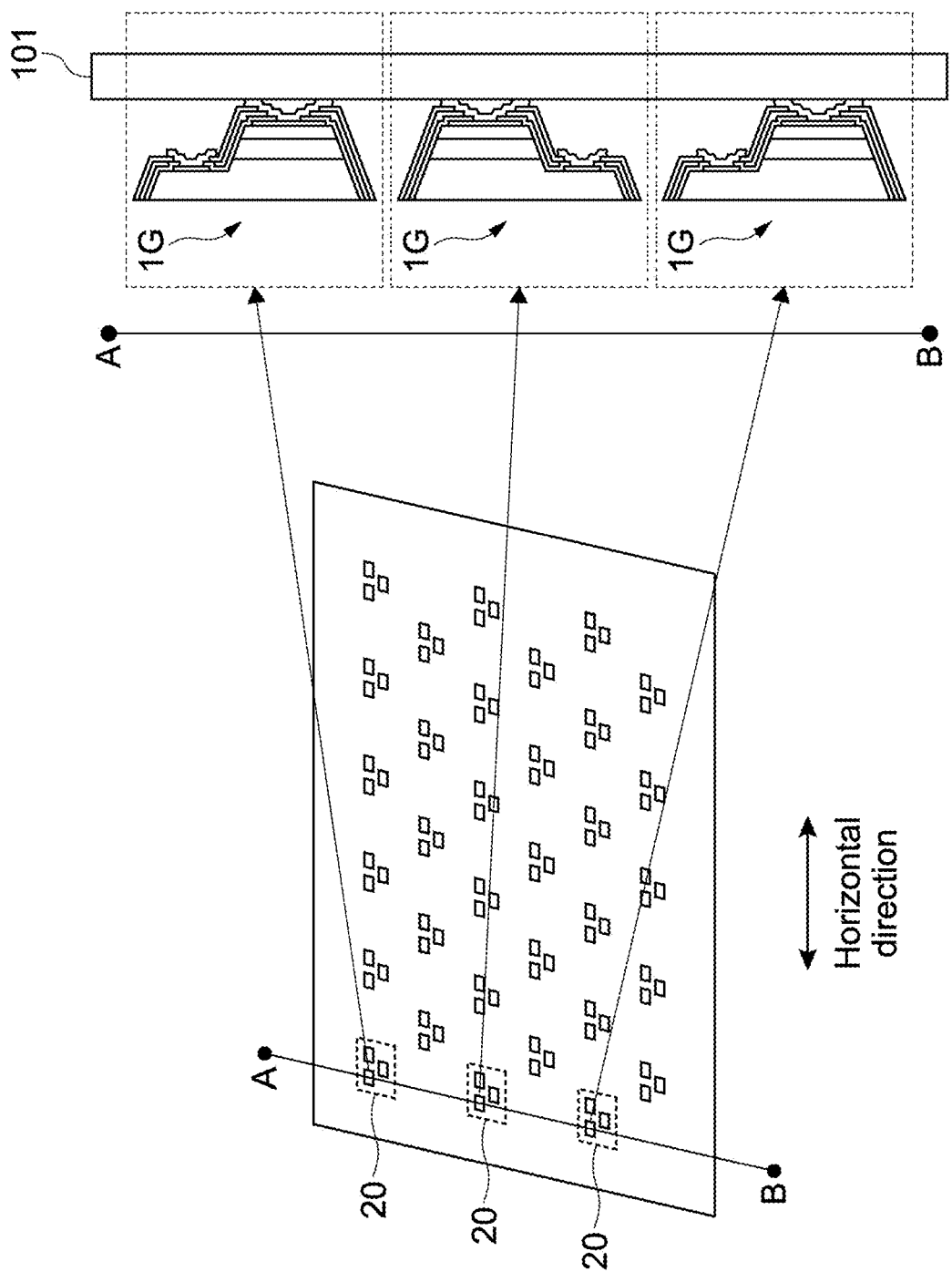
FIG. 10 shows another specific embodiment of a method of arranging the light emitting elements on a mounting substrate of a display apparatus.

Next, another specific method of arranging the light emitting elements 1 on the mounting substrate 101 of the display apparatus 100 will be described. FIG. 10 shows another specific embodiment of a method of arranging the light emitting elements 1 on the mounting substrate 101 of the display apparatus 100.

As shown in FIG. 10, in the light emission unit 20 in a column at a left end of the uppermost column on the display apparatus 100, the light emitting element 1 in a green color included in the light emitting unit 20 is arranged such that the second electrode 6 is at an upper side. In the light emission unit 20 in a third column from the upper of the left end column on the display apparatus 100, the light emitting element 1G in a green color is arranged such that the second electrode 6 is at a lower side.

In this manner, in each pixel (of the light emitting unit 20), one type of the light emitting elements 1 are arranged alternately per pixel (such that the second electrodes 6 are arranged in opposite directions each other), whereby it is possible to provide the uniform intensity distribution over the light emitting apparatus as a whole within the group including a plurality of light emitting elements.

The above description is about another specific method of arranging the light emitting elements 1.

[Specific Arrangement 3 of Light Emitting Elements 1]

Figure 11:
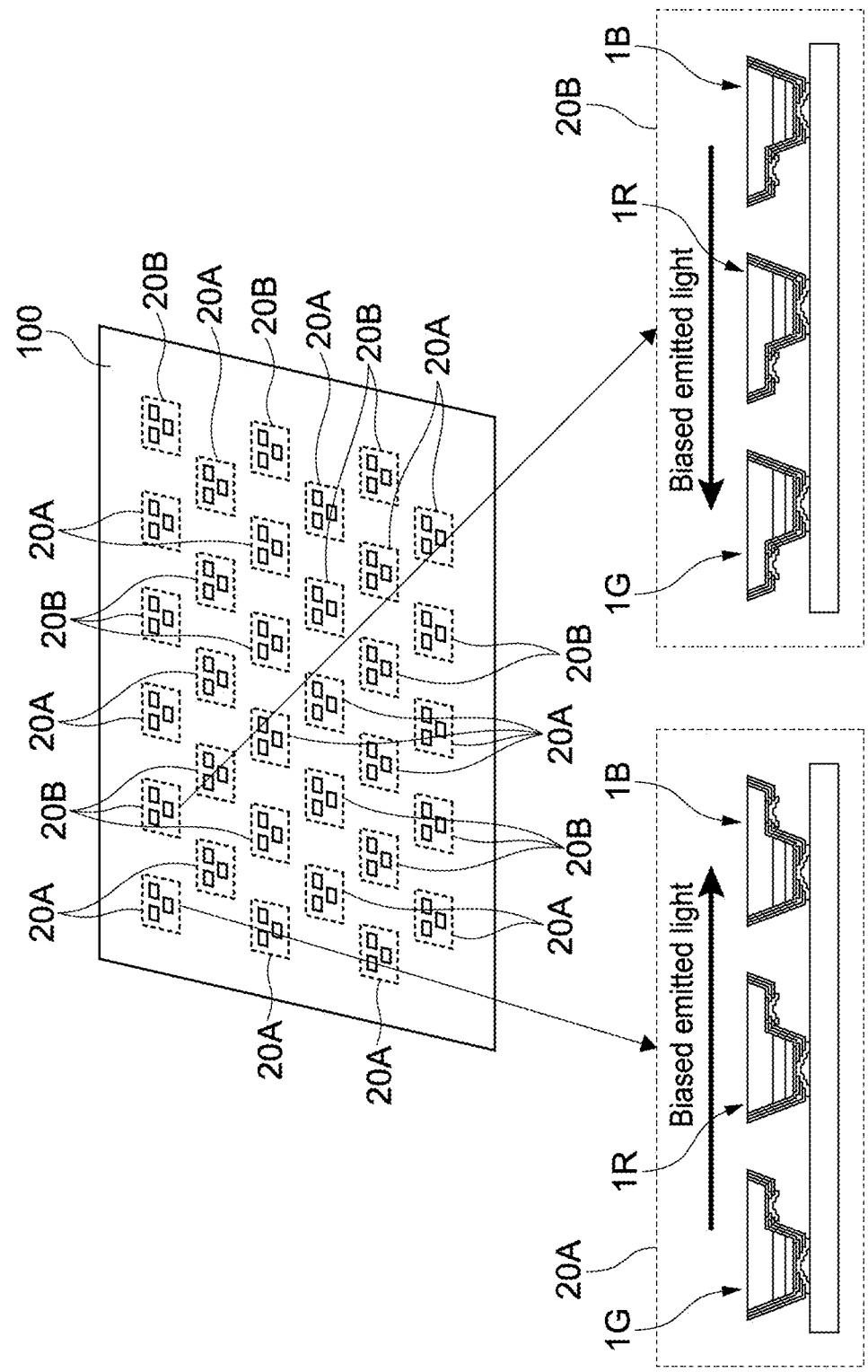
FIG. 11 shows still another embodiment of a method of arranging the light emitting elements on a mounting substrate of a display apparatus.

Next, still another specific method of arranging the light emitting elements 1 on the mounting substrate 101 of the display apparatus 100 will be described. FIG. 11 shows still another embodiment of a method of arranging the light emitting elements 1 on the mounting substrate 101 of the display apparatus 100.

As shown in FIG. 11, in light emission units 20A in a row at a left end of the uppermost column on the display apparatus 100, the light emitting elements 1G, 1R and 1B in green, red and blue colors included in the light emitting unit 20 are arranged such that the second electrodes 6 are at right sides. In light emission units 20B in a second row from the uppermost column on the display apparatus 100, the light emitting elements 1G, 1R 1B in green, red and blue colors are arranged such that the second electrodes 6 are at left sides.

In this manner, in each pixel (of the light emitting units 20A and 20B), the light emitting units may be arranged alternately such that the directions of the light emitting elements 1G, 1R and 1B are opposite.

In this embodiment, two types of the light emitting units are arranged over the mounted substrate 101 of the display apparatus 100 by repeating arranging the light emitting units 20A in two columns from the left end of the display apparatus 100, arranging the light emitting units 20B in two columns at a right side thereof, and further arranging the light emitting units 20A in two columns at a right side thereof.

The above description is about still another specific method of arranging the light emitting elements 1.

[Specific Arrangement 4 of Light Emitting Elements 1]

Figure 12:
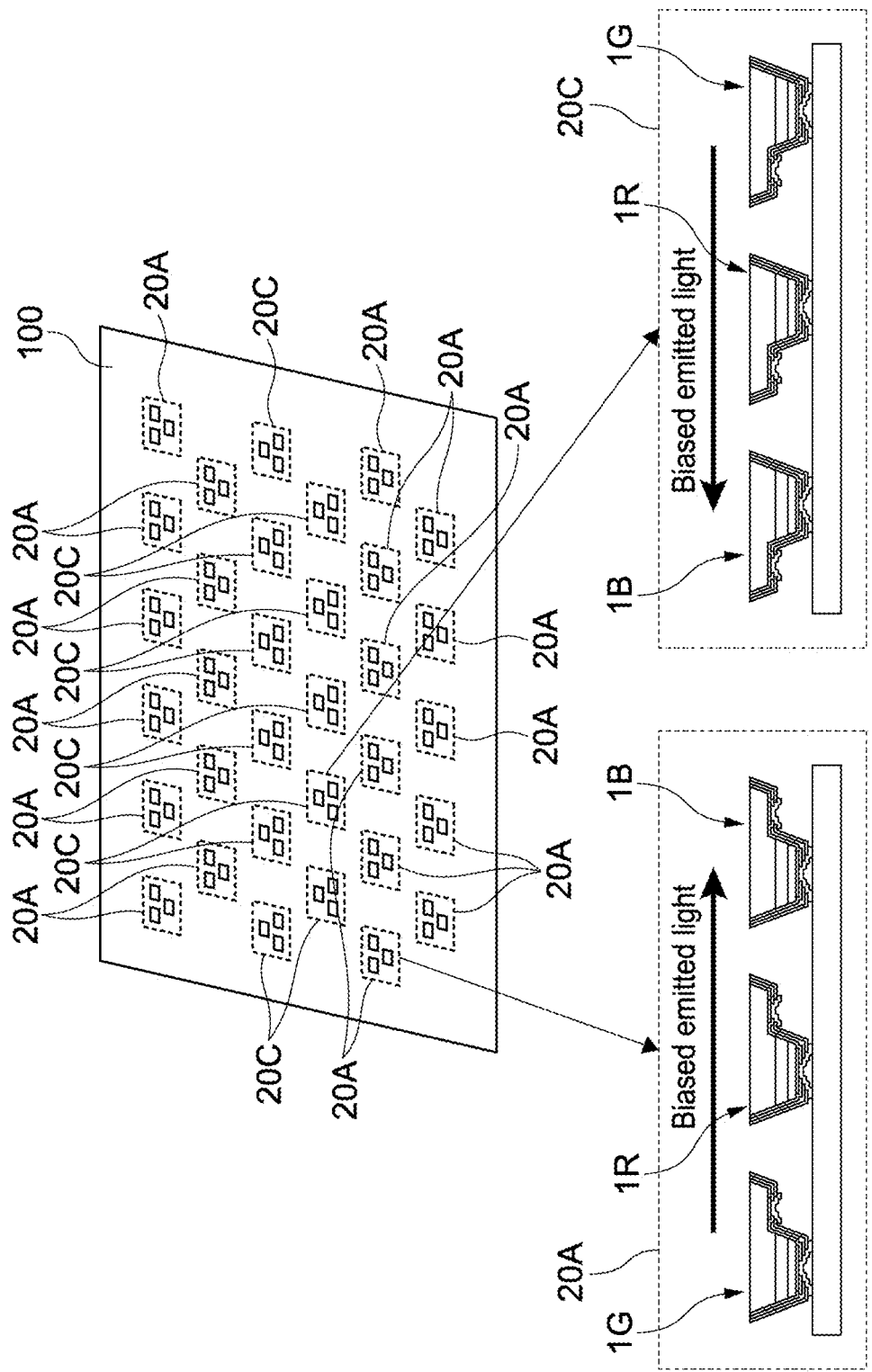
FIG. 12 shows yet another embodiment of a method of arranging the light emitting elements on a mounting substrate of a display apparatus.

Next, yet another specific method of arranging the light emitting elements 1 on the mounting substrate 101 of the display apparatus 100 will be described. FIG. 12 shows yet another embodiment of a method of arranging the light emitting elements 1 on the mounting substrate 101 of the display apparatus 100.

As shown in FIG. 12, in light emission units 20A in a row at a left end of the uppermost column on the display apparatus 100, the light emitting elements 1G, 1R and 1B in green, red and blue colors included in the light emitting unit 20 are arranged such that the second electrodes 6 are at right sides. In light emission units 20C in a third row from a left end column on the display apparatus 100, the light emitting elements 1G, 1R 1B in green, red and blue colors are arranged such that the second electrodes 6 are at left sides.

In the light emitting unit 20A, the green light emitting element 1G is arranged at an upper left side, the blue light emitting element 1B is arranged at an upper right side, and the red light emitting element 1R is arranged at a lower middle part. In the light emitting unit 20C, the red light emitting element 1R is arranged at an upper middle part, the blue light emitting element 1B is arranged at a lower right side, and the green light emitting element 1G is arranged at a lower right side. The light emitting unit 20C may be provided by rotating the light emitting unit 20A 180 degrees.

In this manner, in each pixel (of the light emitting units 20A and 20C), the light emitting units may be arranged alternately such that the directions of the light emitting elements 1G, 1R and 1B are opposite.

In this embodiment, two types of the light emitting units are arranged over the mounted substrate 101 of the display apparatus 100 by repeating arranging the light emitting units 20A in two columns from the left end of the display apparatus 100, arranging the light emitting units 20C in two columns at a right side thereof, and further arranging the light emitting units 20A in two columns at a right side thereof.

The above description is about yet another specific method of arranging the light emitting elements 1.

[Directions where View Angle Dependency should be Removed]

Figure 13:
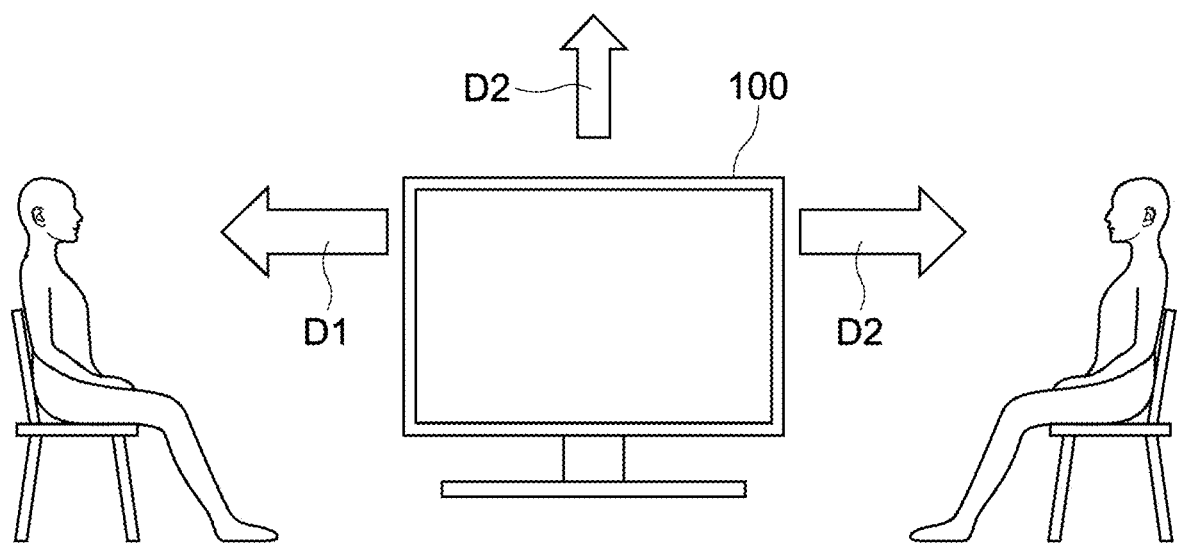
FIG. 13 illustrates directions where view angle dependency should be removed.

Next, it will be described about directions where view angle dependency should be removed (directions where the uniform intensity distribution is necessary). FIG. 13 illustrates directions where view angle dependency should be removed.

As shown in FIG. 13, when the display apparatus 100 is used as a television receiver placed, for example, in a living room, viewpoints of users may be largely shifted in a right and left direction (a horizontal direction) D1 but may not be less shifted in an upper and lower direction (a vertical direction) D2. Accordingly, in the horizontal direction D1, the uniform intensity distribution of the display apparatus 100 is necessary to remove the view angle dependency, but in the vertical direction D2, taking the view angle dependency into account is unnecessary.

In an opposite manner, when the display apparatus 100 is, for example, placed in an airport or a station yard facing to users getting on a descending escalator, viewpoints of the users may be largely shifted in the up and down direction, but may not be less shifted in the left and right direction. Accordingly, the direction where the view angle dependency should be removed is the vertical direction D2.

The above description is about the view angle dependency should be removed. The view angle dependency should be removed will be further described below.

Figure 14:
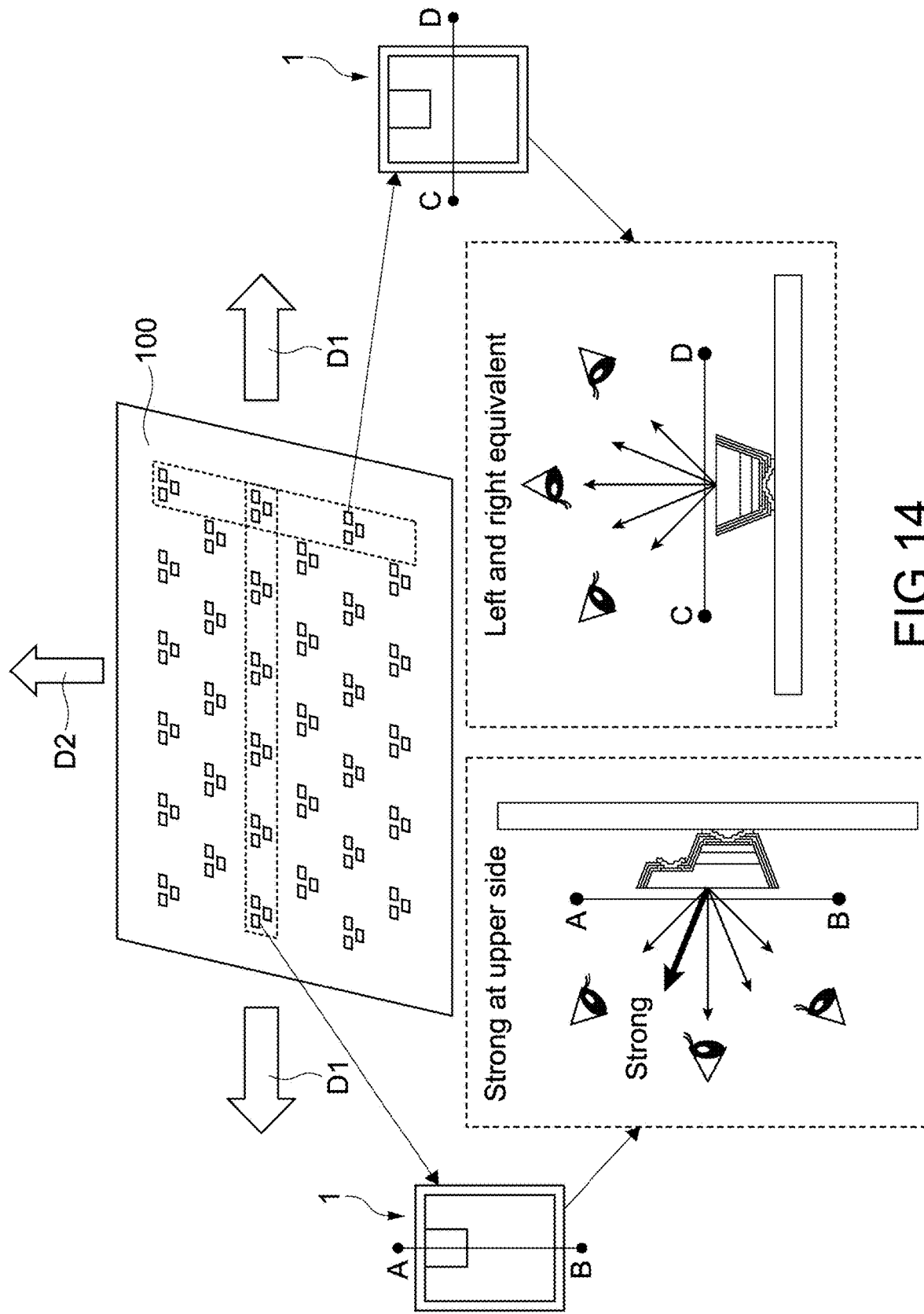
FIG. 14 illustrates a method of arranging the light emitting elements taking the directions where view angle dependency should be removed into account.

Alternative Embodiment 2: Arrangement of Light Emitting Elements 1 Taking Directions where View Angle Dependency should be Removed into Account Next, a method of arranging the light emitting elements 1 taking the directions where the view angle dependency should be removed into account will be described. The arrangement method is a technology different from the technology that the biased intensity distribution is complemented to remove non-uniformity of the intensity distribution over the display apparatus as a whole. FIG. 14 illustrates a method of arranging the light emitting elements 1 taking the directions where the view angle dependency should be removed into account.

In FIG. 14, the direction where the view angle dependency should be removed, i.e., the direction where the uniform intensity distribution is necessary, is supposed to the horizontal direction (the left and right direction) D1. The vertical direction (the up and down direction) D2 may have the view angle dependency.

In the display apparatus 100 shown in FIG. 14, the light emitting elements 1 are arranged on the mounting substrate 101 with the second electrodes upside. When the viewpoints are shifted in an A-B direction (the vertical direction D2), the light intensity emitted from the light emitting elements 1 to the upper side becomes strong, and the intensity distribution over the display apparatus 100 as a whole is biased in the vertical direction D2.

In contrast, when the viewpoints are shifted in a C-D direction (the horizontal direction D1) orthogonal to the A-B direction, the light intensity emitted from the light emitting elements 1 becomes left-right symmetry and the intensity distribution is not biased. Also, over the display apparatus 100 as a whole, the intensity distribution is not biased.

In this manner, depending on the applications of the display apparatus 1, the view angle dependency in the above-described direction can be removed by fitting the direction where the view angle dependency should be removed (the horizontal direction D1 in the embodiment) into the direction where the light emitting element 1 is not structurally biased (the C-D direction in the embodiment).

The above description is about the method of arranging the light emitting elements 1 taking the directions where the view angle dependency should be removed into account.

[Other Advantages of Present Disclosure]

Next, other advantages of the present disclosure being not referred in the above description will be described. FIG. 15 shows a difference between a display apparatus 99 not according to an embodiment of the present disclosure and the display apparatus 100 according to an embodiment of the present disclosure in a final inspection process.

As shown in FIG. 15, in the final inspection process of the display apparatus 99 not according to the embodiment of the present disclosure, the difference between the light intensity should be inspected from two points, i.e., right and left sides. In contrast, in the display apparatus 100 according to the embodiment of the present disclosure, the intensity distribution may be inspected only at one point.

In this way, a brightness correction of the display apparatus 100 according to the embodiment of the present disclosure can be advantageously omitted in the final inspection process. No brightness correction allows an adjustment mechanism therefor to be omitted, too.

In addition, a screening step of the light emitting elements can also be advantageously omitted in the production process of the display apparatus 100. When the present disclosure is not used, the light emitting element 1 having the great biased intensity distribution should be screened from the light emitting element 1 having the minute biased intensity distribution shown in an upper view of FIG. 16 and only the light emitting element 1 having the bias within a reference value should be used.

In contrast, in the production process of the display apparatus 100 according to the embodiment of the present disclosure, the bias of the intensity distribution of the light emitting element 1 can be complemented. Therefore, the light emitting element 1 having the great biased intensity distribution can be used.

The above description is about other advantages of the present disclosure.

Application Embodiment 1: Application of Light Emitting Elements 1 to Illumination Apparatus Next, an application of the above-described light emitting elements 1 to an illumination apparatus will be described. When used for illumination, the light emitting elements 1 are desirably white. Also in the illumination apparatus, users are sensitive to a change in the light intensity due to viewpoint shifts and the uniform intensity distribution is also desirable similar to the display apparatus 100.

Figure 17:
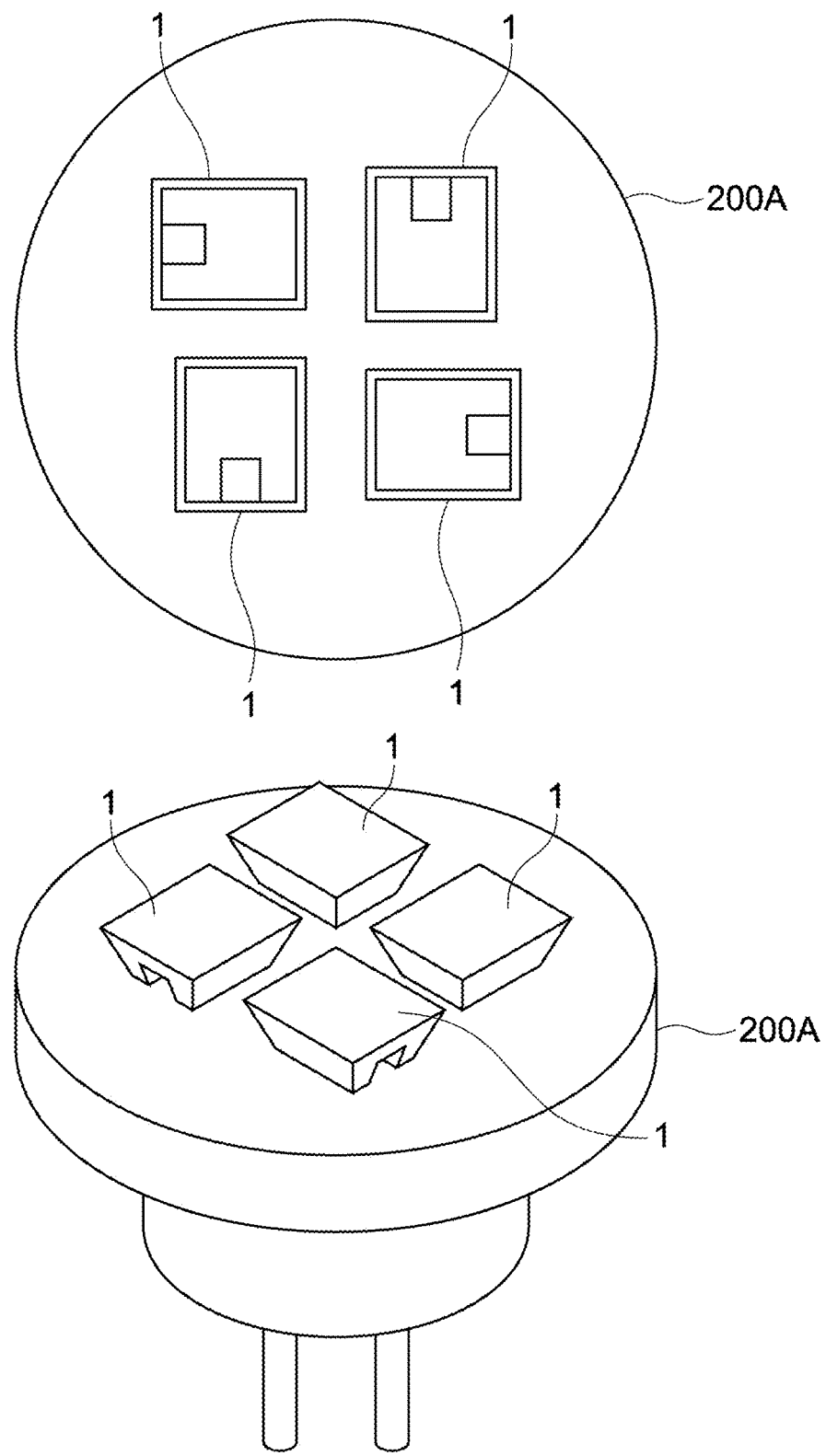
FIG. 17 shows an illustrated illumination apparatus using the light emitting elements.

FIG. 17 shows an illustrated illumination apparatus 200A using the light emitting elements 1. An upper view of FIG. 17 is a top view of the illumination apparatus 200A where four light emitting elements 1 are arranged on a circle mounting stage (mounting substrate) such that the second electrodes 6 are directed to four different directions each other in a point symmetry. A lower view of FIG. 17 is a perspective view of the illumination apparatus 200A. It should be appreciated that the light emitting elements 1 may be arranged in other way other than the point symmetry.

Figure 18:
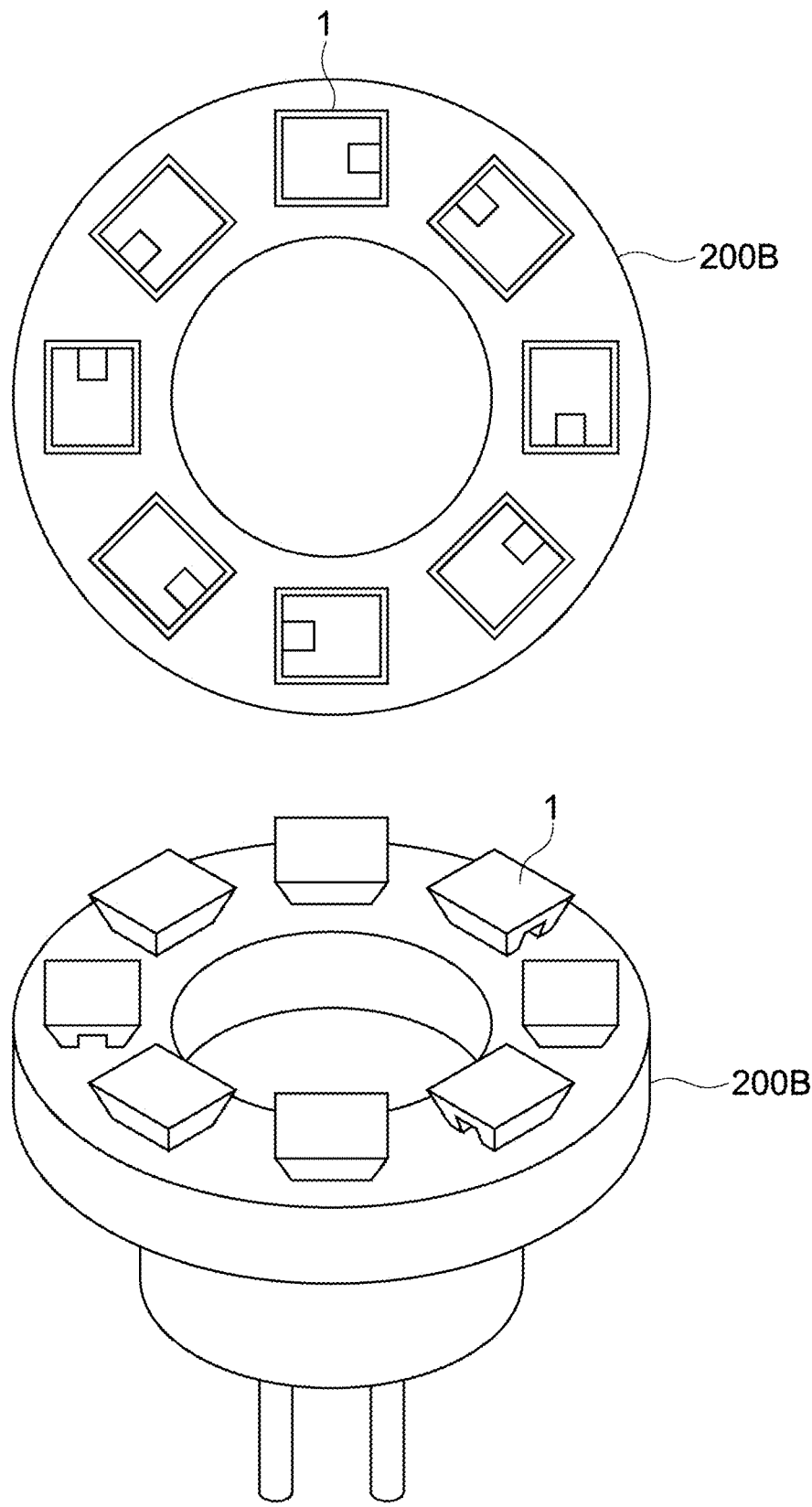
FIG. 18 shows another illustrated illumination apparatus using the light emitting elements.

FIG. 18 shows another illustrated illumination apparatus 200B using the light emitting elements 1. An upper view of FIG. 18 is a top view of the illumination apparatus 200B where eight light emitting elements 1 are arranged on a circle mounting stage such that the second electrodes 6 are disposed on a circumference of the circle in opposite directions alternately as a point symmetry. A lower view of FIG. 18 is a perspective view of the illumination apparatus 200B. It should be appreciated that other arrangements other than the point symmetry may be adapted.

Figure 19:
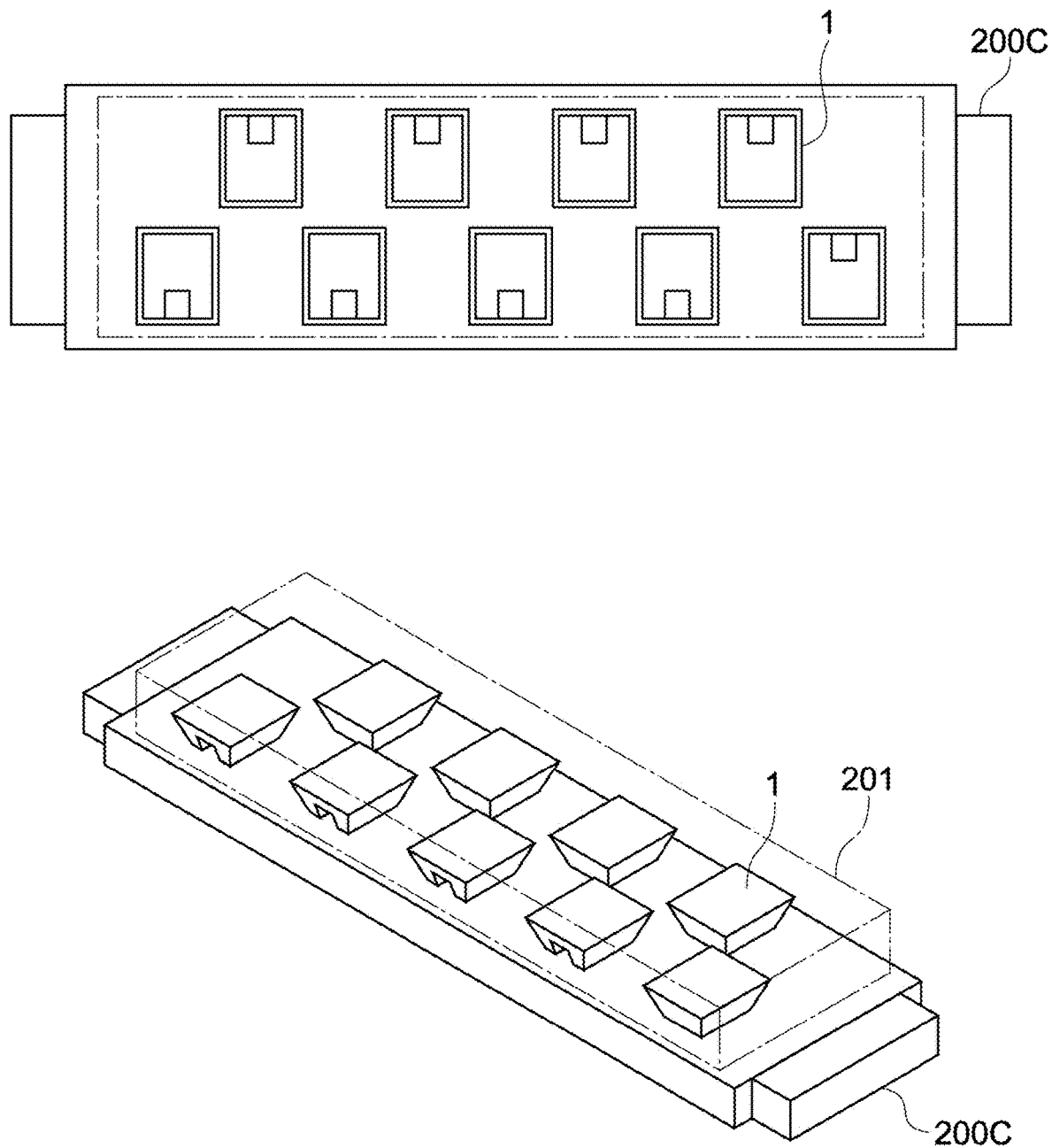
FIG. 19 shows a still another illustrated illumination apparatus using the light emitting elements.

FIG. 19 shows a still another illustrated illumination apparatus 200C using the light emitting elements 1. An upper view of FIG. 19 is a top view of the illumination apparatus 200C where nine light emitting elements 1 are arranged on a rectangular mounting stage such that the second electrodes 6 are faced in opposite directions alternately. A lower view of FIG. 19 is a perspective view of the illumination apparatus 200C. The illumination apparatus 200C may include a cover 201 for a ceiling light.

The above description is about the application of the light emitting apparatus 100 to the illumination apparatus.

Second Embodiment

Next, a second embodiment will be described. In the first embodiment, there is described the technology that the biased intensity distribution caused by the non-uniform structure of the light emitting element 1 is modified. Alternatively, in the second embodiment, there is described the technology that the biased intensity distribution caused by the arrangement of a plurality of the light emitting elements 1 in the light emitting unit 20 is modified.

According to the technology here described, three or more light emitting elements 1 are arranged on a mounting substrate (a first mounting substrate) of each light emitting unit 20. These light emitting elements are arranged and deviated in first and second directions orthogonal to each other where a requested view angle in the first direction is higher than that in the second direction.

The technology here described is effective to the light emitting elements having no biased intensity distribution caused by a structural asymmetry of each light emitting element itself.

[Arrangement Having View Angle Dependency]

Figure 20:
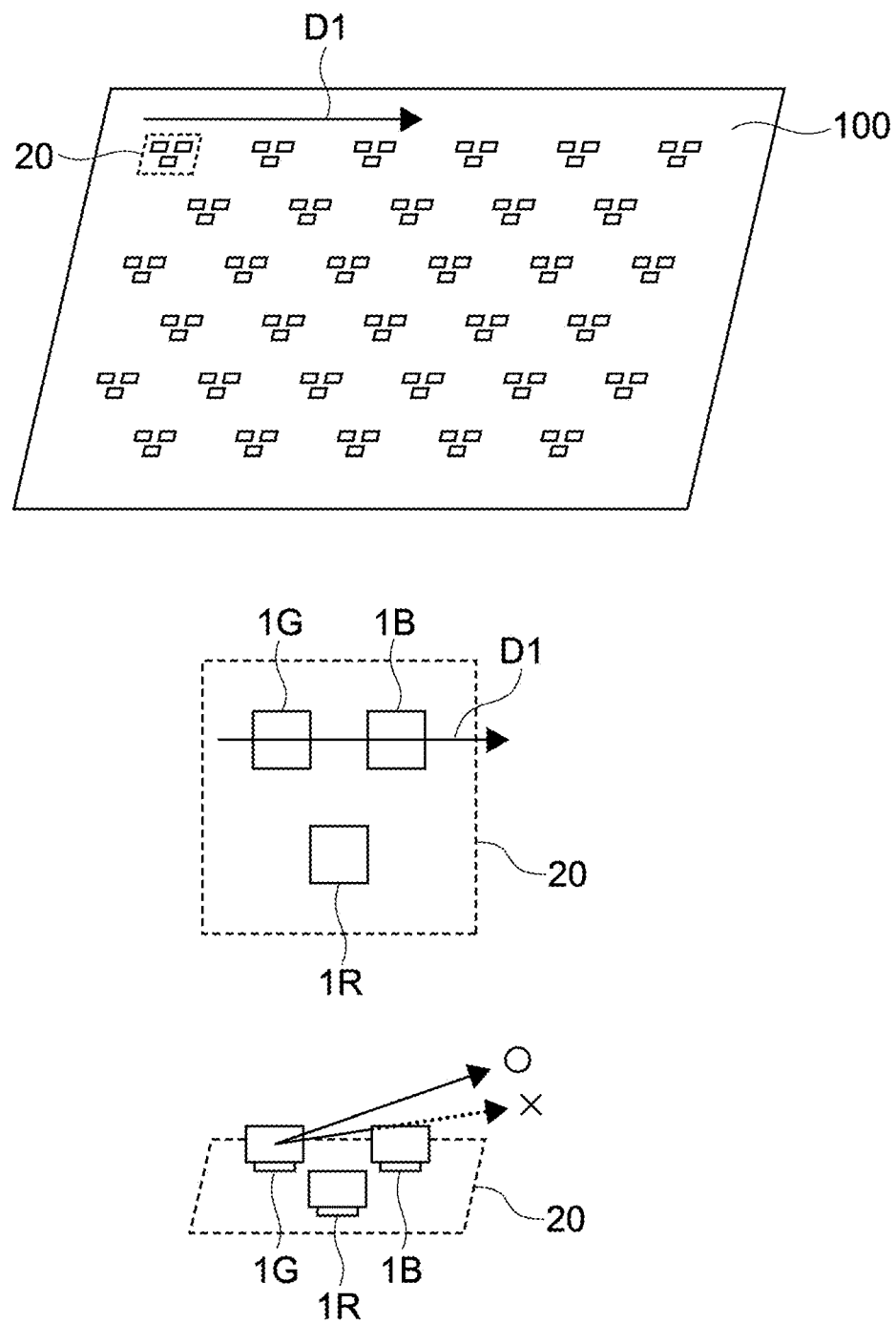
FIG. 20 illustrates a generation of the biased intensity distribution (a view angle is limited) caused by a special arrangement of the light emitting elements in light emitting units.

FIG. 20 illustrates a generation of the biased intensity distribution (a view angle is limited) caused by a special arrangement of the light emitting elements 1 in the light emitting units 20. An upper view of FIG. 20 shows arrangement of the light emitting units 20 on the display apparatus 100. A middle view of FIG. 20 shows a top view of the light emitting unit 20. A lower view of FIG. 20 shows a perspective view of the light emitting unit 20. Here, the direction where the view angle dependency should be removed is the horizontal direction D1.

As shown in the top view of the light emitting units 20, the green light emitting element 1G and the blue light emitting element 1B are arranged in a row in the horizontal direction D1 of the light emitting units 20. As shown by the perspective view of the light emitting unit 20, light emitted from the green light emitting element 1G at a shallower angle is incident and absorbed on/by the blue light emitting element 1B adjacent.

Accordingly, users can observe no green light at a right end of the display apparatus 100. The same applies to a left end of the display apparatus 100. The same problem occurs in the blue light emitting element 1B arranged in a row with the green light emitting element 1G in the horizontal direction D1.

[Arrangement Having No View Angle Dependency]

Figure 21:
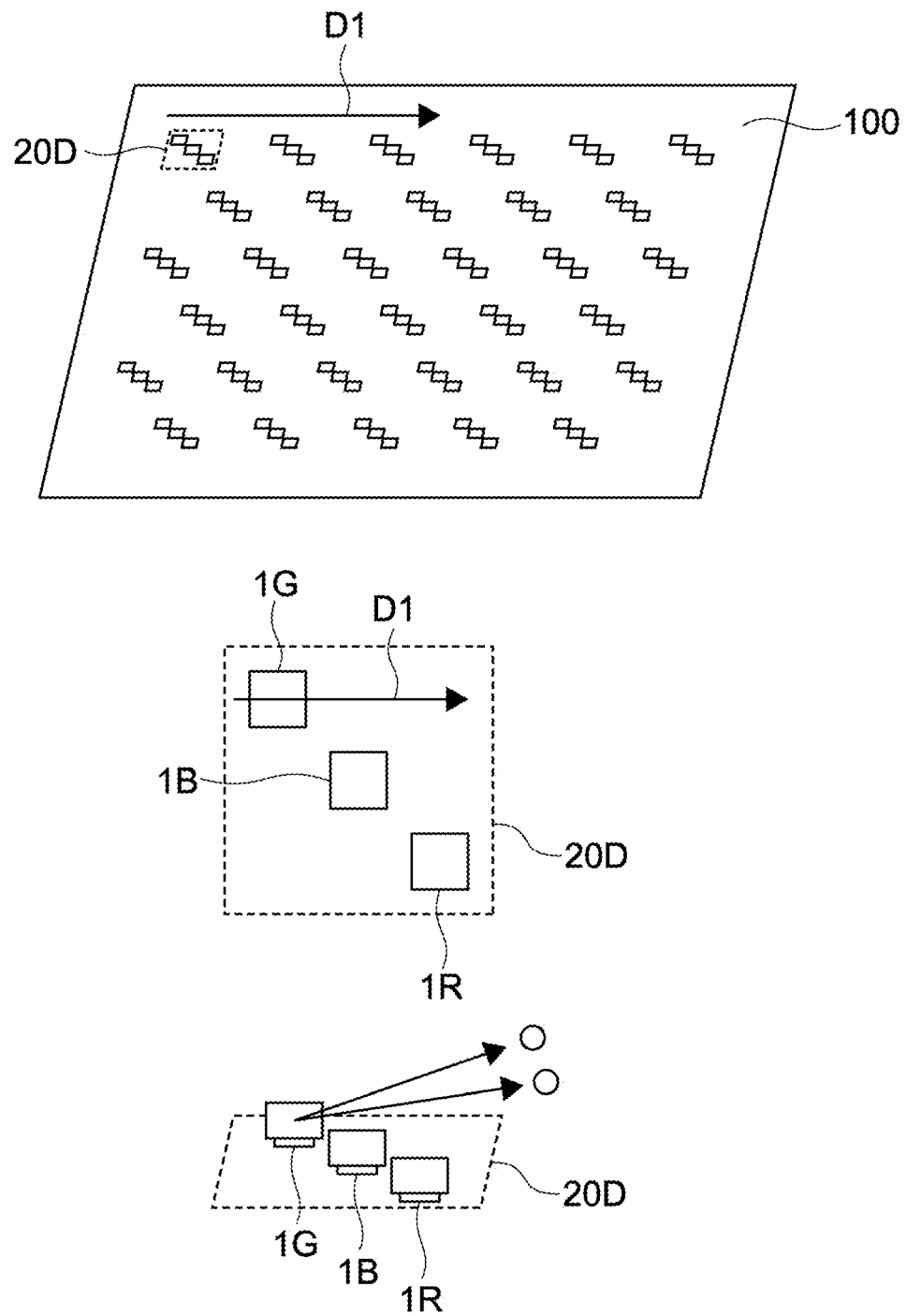
FIG. 21 shows a state that the light emitting elements adjacent are arranged in the positions displaced from the directions where the view angle dependency should be removed in one light emitting unit.

Next, a method of solving the problem will be described. FIG. 21 shows an embodiment to solve the problem showing that a state that the light emitting elements 1 adjacent are arranged in the positions displaced from the direction D1 where the view angle dependency should be removed in one light emitting unit 20D. An upper view of FIG. 21 shows arrangement of the light emitting units 20D on the display apparatus 100. A middle view of FIG. 21 shows a top view of the light emitting unit 20D. A lower view of FIG. 21 shows a perspective view of the light emitting unit 20D.

As shown in the perspective view of the light emitting unit 20D, for example, the blue light emitting element 1B is arranged adjacent to the green light emitting element 1G by displacing the blue light emitting element 1B from the green light emitting element 1G in the horizontal direction D1.

Accordingly, light emitted from the green light emitting element 1G to the horizontal direction D1 at a shallower angle is detected by users without inhibiting by the blue light emitting element 1B unlike in the light emitting unit 20. Thus, there can be provided the uniform intensity distribution (a view angle is less limited) in the horizontal direction D1 where the view angle dependency should be removed. Although the vertical direction D2 is not defined as the direction where the view angle dependency should be removed in the light emitting unit 20D, it reveals that the view angle can be less limited.

In the top view of each above-described light emitting unit 20D, the blue light emitting element 1B is arranged at a lower right of the green light emitting element 1G, and the red light emitting element 1R is arranged at a lower right of the blue light emitting element 1B. However, the arrangement of each light emitting element is not limited thereto, and may be such that the light emitting element 1 adjacent may be displaced from the direction where the view angle dependency should be removed and the light emitted at a shallower angle may be not inhibited by the light emitting element 1 adjacent.

[Other Arrangements]

When the direction where the view angle dependency should be removed is the horizontal direction D1, the green light emitting element 1G, the blue light emitting element 1B and the red light emitting element 1R may be arranged in a column in the up and down direction (the vertical direction D2).

When the direction where the view angle dependency should be removed is the vertical direction D2, the green light emitting element 1G, the blue light emitting element 1B and the red light emitting element 1R may be arranged in a row in the left and right direction (the horizontal direction D1).

[Displacement Amount of Light Emitting Element 1]

In the light emitting units 20, an arrangement space between the respective light emitting elements 1 (a displacement amount being displaced from the direction where the view angle dependency should be removed) may be based on a size (in the above-described embodiment, 5 μm to 100 mm) of one light emitting element 1. For example, a pitch between pixels (the light emitting units) is generally 1 mm to 2 mm. In a 55-inch display apparatus having a full HD resolution, the pitch is about 1 mm. Then, the space between the light emitting elements 1 (the displacement amount) will be 0.5 mm or less.

The light emitting elements 1 may be contacted each other. When one light emitting element 1 is not capable of displacing from other light emitting element 1 by the size of the light emitting element 1 in the direction where the view angle dependency should be removed, adjacent light emitting elements 1 may be partly overlapped in the direction where the view angle dependency should be removed. Even in this case, the view angle dependency can be decreased as compared to the case where the adjacent light emitting elements 1 are arranged in a line in the direction where the view angle dependency should be removed.

[Height of Light Emitting Element]

When the respective light emitting elements 1 are arranged by displacing from the direction where the view angle dependency should be removed in the light emitting units 20, heights of the respective light emitting elements 1 may be taken into consideration. Although depending on the structures of the light emitting elements, the red light emitting element 1R is highest, the green light emitting element 1G has a middle height, and the blue light emitting element 1B is lowest.

The above description is about the technology that the biased intensity distribution caused by the non-uniform structure of a plurality of the light emitting elements 1 is modified in each light emitting unit 20.

Third Embodiment

Next, a third embodiment will be described. In the first embodiment, the uniform intensity distribution over the display apparatus as a whole is provided in an assumption that the light emitting elements 1 having the biased intensity distribution is used. In contrast, the third embodiment will describe the technology that each light emitting element has a uniform intensity distribution.

[Structure of Light Emitting Elements]

FIG. 22 shows the light emitting element 1 having the biased intensity distribution and a light emitting element 31 having a uniform intensity distribution. A left view of FIG. 22 is the light emitting element 1 having the biased intensity distribution and emits strong light from the second electrode 6 side.

A right view of FIG. 22 is the light emitting element 31 having the uniform intensity distribution. A difference between the light emitting element 1 and the light emitting element 31 is a reflection layer 30 formed in contact with the first electrode 7 under the first electrode 7 (the first electrode layer) opposite to the first conductive layer 5.

The reflection layer 30 is a metal film having poor reflectance, for example. By forming the reflection layer 30 on the light emitting element 31, the reflection of the light emitted from the active layer 4 can be inhibited.

In other words, when viewed from the top face of the light emitting element, the semiconductor layer, the first electrode 7, the second electrode 6 and the reflection layer 30 are arranged offset from the middle of the light emitting element. The light emitted from the active layer 4 and the light reflected by the reflection layer 30 are complemented, thereby providing the uniform light intensity emitted from the light emitting element.

More specifically, when the reflection layer 30 is formed, the uniform intensity distribution can be provided.

In the third embodiment, although an LED chip having an FC structure is used as an example of the light emitting element 31, the advantages by the third embodiment can also be provided by using a light emitting element having a double-faced electrode structure.

[Simulation 1 about Structure of Light Emitting Element 31 and Intensity Distribution]

Next, a change in the intensity distribution in the light emitting element 31 by the reflectance of the reflection layer is simulated.

Figure 23:
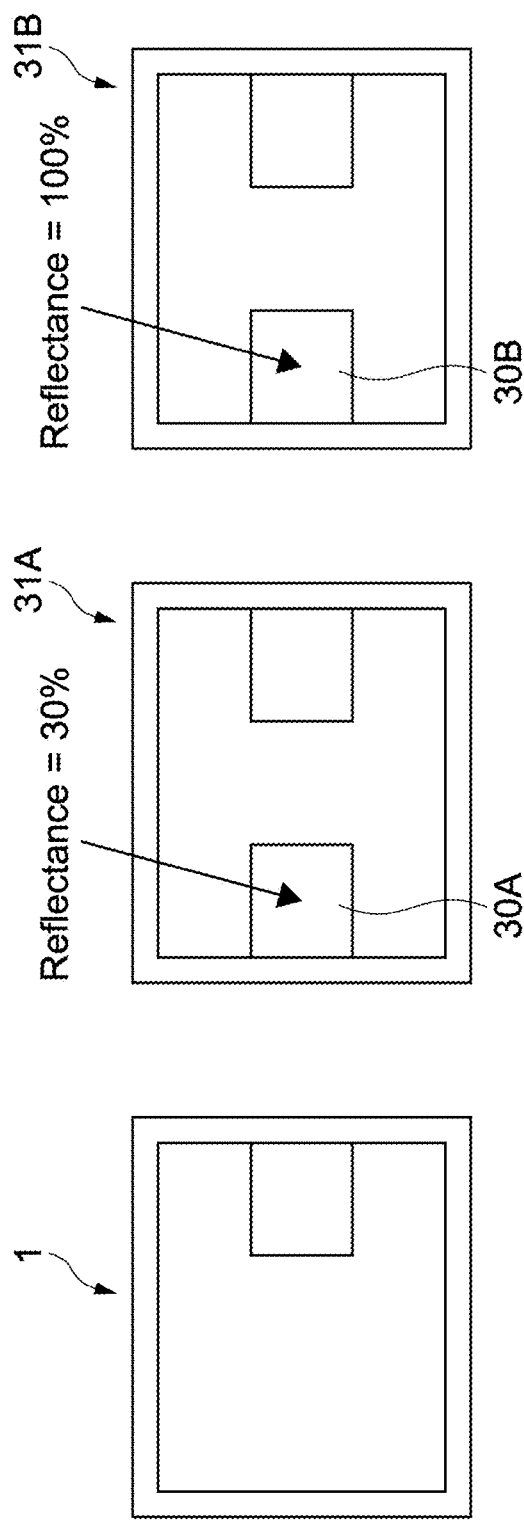
FIG. 23 illustrates three simulated cases.

FIG. 23 illustrates three simulated cases. A left view of FIG. 23 shows the light emitting element 1. A middle view of FIG. 23 shows a light emitting element 31A having a reflection layer 30A with a reflectance of 30%. A right view of FIG. 23 shows a light emitting element 31B having a reflection layer 30B with a reflectance of 100%.

As apparent from FIG. 23, the reflection layers 30A and 30B are disposed at positions being in line symmetry with the second electrodes 6 viewed from upper faces of the light emitting elements 31A and 31B, respectively. The reflection layers 30A and 30B are formed at the same position and have the same area excluding the reflection indices.

Figure 24:
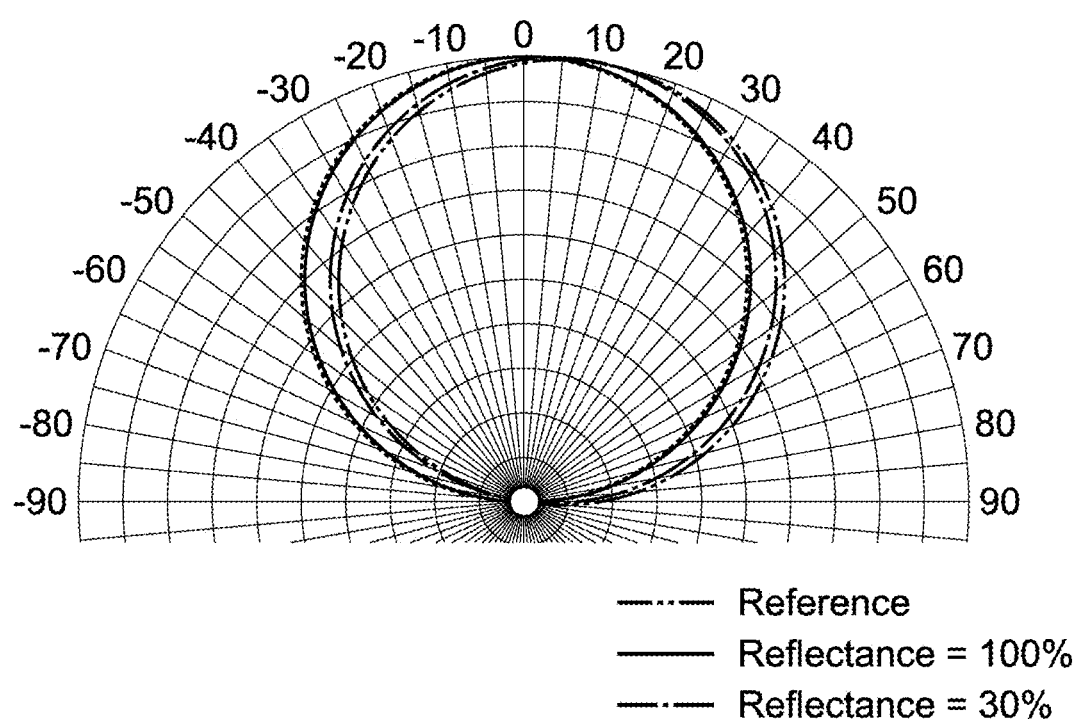
FIG. 24 is a graph showing results of the FFP of the polar coordinate system in the three simulated cases.

FIG. 24 is a graph showing results of the FFP of the polar coordinate system in the three simulated cases. As shown in the graph, the intensity distribution (shown in a dashed two-dotted line) of the light emitting element 1 is most biased to a right side. The intensity distribution (shown in a dashed dotted line) of the light emitting element 31A having the reflectance of 30% is somewhat centered, which shows an improvement in the uniformity. The intensity distribution (shown in a solid line) of the light emitting element 31B having the reflectance of 100% is substantially overlapped with a dotted line showing an entirely uniform intensity distribution, which shows no bias in the intensity distribution.

Figure 25:
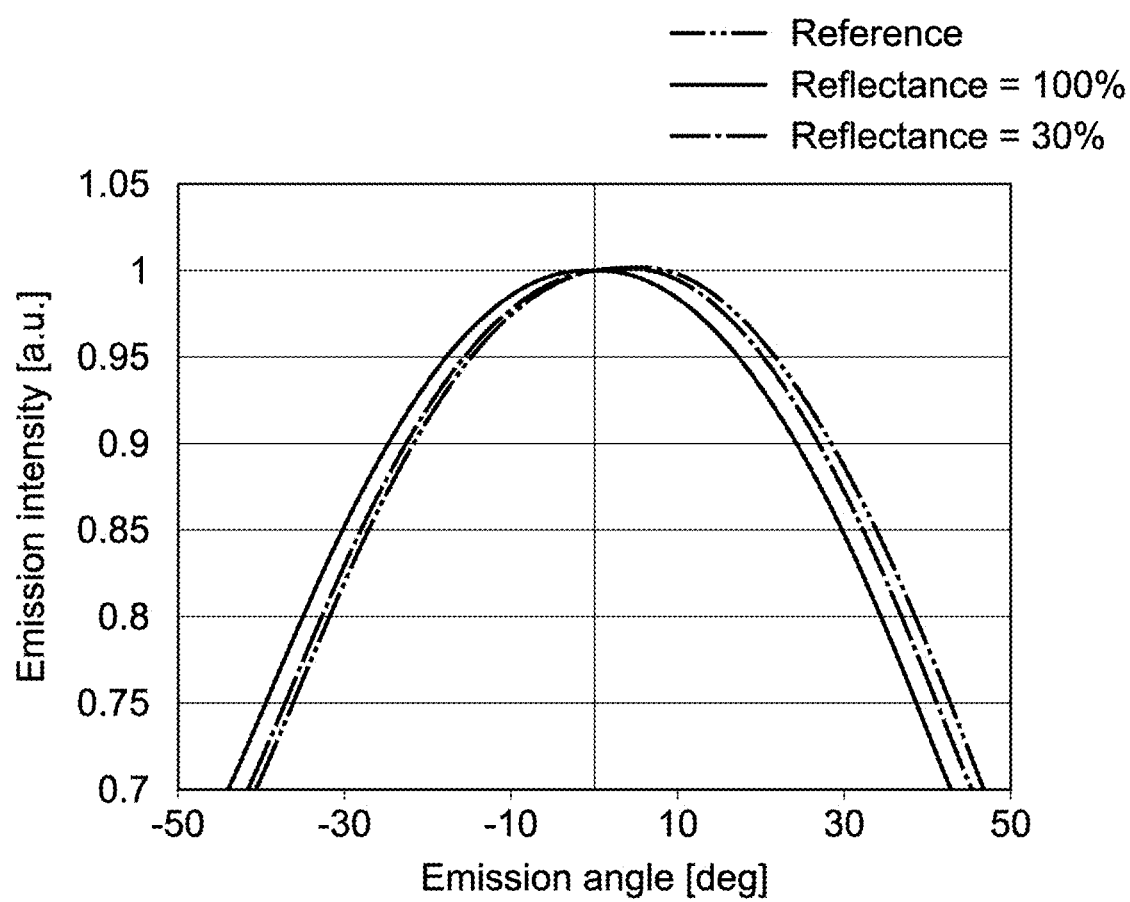
FIG. 25 is a graph showing results of the FFP of the orthogonal coordinate system in the three simulated cases.

FIG. 25 is a graph showing results of the FFP of the orthogonal coordinate system in the three simulated cases. Also from the graph, the same is applied to the three simulated cases. The intensity distribution of the light emitting element 31B having the reflectance of 100% has no bias (has the Lambert reflection property).

[Simulation 2 about Structure of Light Emitting Element 31 and Intensity Distribution]

Next, a relationship between the reflectance and the area of the reflection layer is simulated in order to keep the Lambert reflection property.

Figure 26:
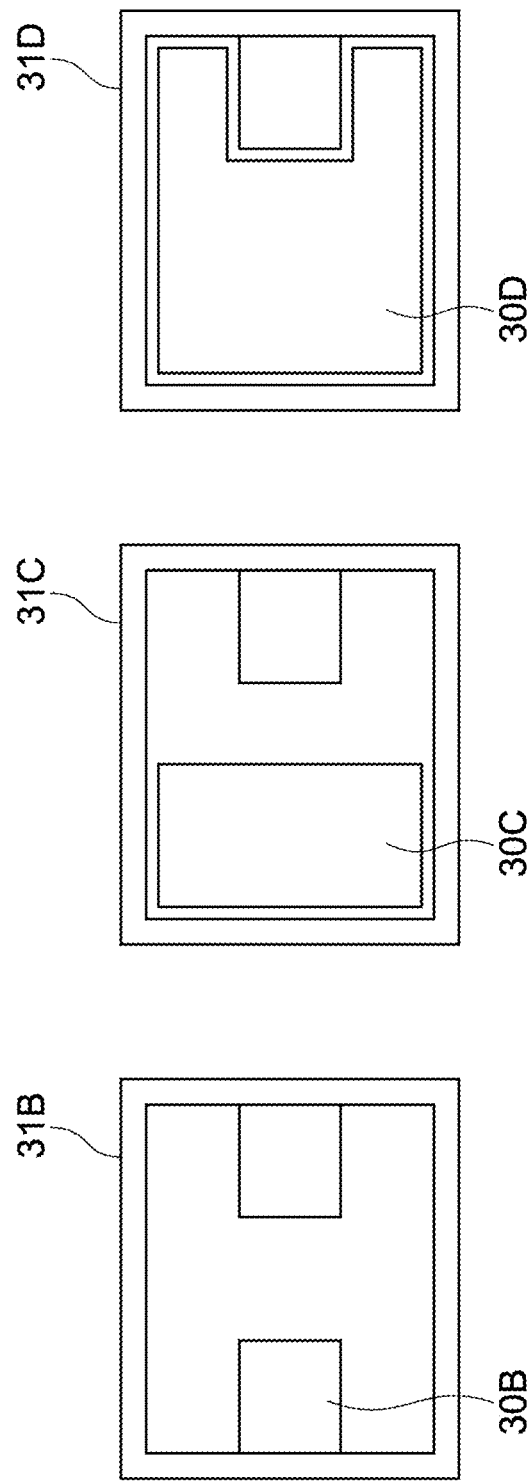
FIG. 26 illustrates three simulated cases.

FIG. 26 illustrates three simulated cases. A left view of FIG. 26 shows the light emitting element 31B. In the light emitting element 31B, the area of the reflection layer 30B is about 10% of the total area (the upper face) of the light emitting element 31B view from the above.

A middle view of FIG. 26 shows the light emitting element 31C. In the light emitting element 31C, the area of the reflection layer 30C is about 30% of the total area of the light emitting element 31B view from the above.

A right view of FIG. 26 shows the light emitting element 31D. In the light emitting element 31D, the area of the reflection layer 30D is about 90% of the total area of the light emitting element 31B view from the above.

Figure 27:
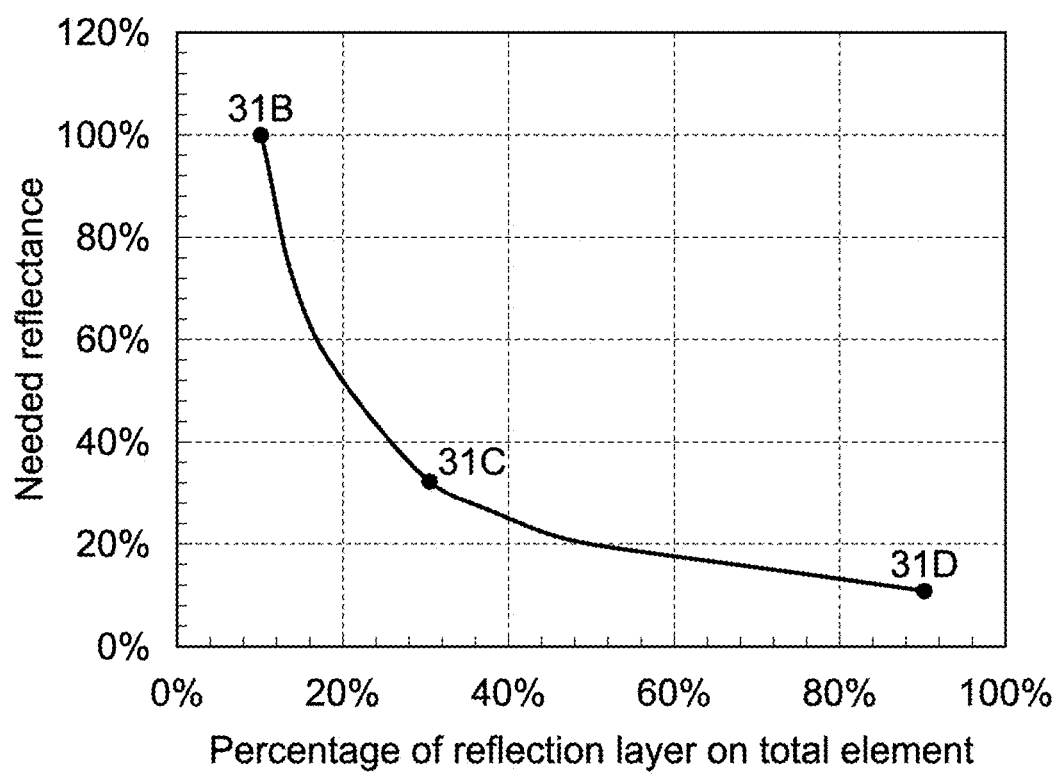
FIG. 27 is a graph showing a result of reflectance of a reflection layer where the light emitting elements have the uniform intensity distribution (has the Lambert reflection property) in the three simulated cases.

FIG. 27 is a graph showing a result of reflectance of a reflection layer where the light emitting element has the uniform intensity distribution (has the Lambert reflection property) in the three simulated cases.

As seen from the graph, when the area of the reflection layer is about 10% of the total area of the element, needed reflectance of the reflection layer is 100%. When the area of the reflection layer is about 30%, the needed reflectance is about 32%. When the area of the reflection layer is about 90%, the needed reflectance is about 10%.

As just described, there is a variety of combinations of the area and the reflectance of the reflection layer needed for providing the uniform intensity distribution of the light emitting element. By selecting the combination being compatible with other limitations from the combination of the area and the reflectance, there can be provided the light emitting element having the uniform intensity distribution even though the light emitting element has the asymmetry structure offset from the middle.

As the light emitting element 31 itself has the uniform intensity distribution, the light emitting unit, the light emitting apparatus, the illumination apparatus, the display apparatus and the electronic device using the light emitting element 31 can have the uniform intensity distribution.

<Supplemental>

The technologies described in the above embodiments can be combined each other. For example, it should be appreciated that the light emitting element, the light emitting unit and the display apparatus can be incorporated into the electronic device illustrated in the first embodiment.

The present disclosure is not limited to the above-described embodiments, and variations and modifications may be made without departing from the scope of the present disclosure.

The present disclosure may have the following configurations.

(1) A light emitting apparatus, including:
a plurality of light emitting elements having biased light properties; and
a mounting substrate where the light emitting elements are arranged such that the biased light properties are complemented within a group including at least two light emitting elements among a plurality of the light emitting elements.

(2) The light emitting apparatus according to (1) above, in which
the light emitting elements are arranged such that biased intensity distributions in the light properties are faced to different directions within the group.

(3) The light emitting apparatus according to (2) above, in which
total intensity distributions combined are in a point symmetry within the group.

(4) The light emitting apparatus according to any of (1) to (3) above, in which
each of the light emitting elements has
a semiconductor layer where a first conductive layer, an active layer and a second conductive layer are laminated,
a first electrode layer electrically connected to the first conductive layer,
a second electrode layer electrically connected to the second conductive layer; and
the semiconductor layer, the first electrode layer and the second electrode layer are offset from a middle of each of the light emitting elements viewed from an upper face of each of the light emitting elements.

(5) The light emitting apparatus according to (1) above, in which
one of the light properties is an intensity distribution or a wavelength.

(6) A display apparatus, including:
a plurality of light emitting units each including one pixel configured of a plurality of light emitting elements having biased light properties and having different light emitting wavelengths each other;
a mounting substrate where a plurality of the light emitting units are arranged such that the biased light properties are complemented within a group configured of the light emitting elements having the same wavelength and at least two light emitting units of a plurality of the light emitting units; and
a driving circuit for driving the light emitting elements based on a video signal.

(7) The display apparatus according to (6) above, in which
the light emitting units includes
a first light emitting unit configured of a plurality of the light emitting elements arranged to have the biased intensity distributions in the light properties in a first direction; and
a second light emitting unit configured of a plurality of the light emitting elements arranged to have the biased intensity distributions in the light properties in a second direction opposite to the first direction, and in which
the first light emitting unit and the second light emitting unit are arranged alternately per block in a predetermined number of rows and columns on the mounting substrate.

(8) The display apparatus according to (6) above, in which
the light emitting units include
a first light emitting unit where the light emitting elements are arranged such that the biased intensity distributions are in a first direction; and
a second light emitting unit where the first light emitting unit is rotated for 180 degrees such that the biased intensity distributions are in a second direction opposite to the first direction; and in which
the first light emitting unit and the second light emitting unit are arranged alternately per block in a predetermined number of rows and columns on the mounting substrate.

(9) An electronic device, including:
a display apparatus, including:
a plurality of light emitting units each including one pixel configured of a plurality of light emitting elements having biased light properties and having different light emitting wavelengths each other;
a mounting substrate where a plurality of the light emitting units are arranged such that the biased light properties are complemented within a group configured of the light emitting elements having the same wavelength and at least two light emitting units of a plurality of the light emitting units; and
a driving circuit for driving the light emitting elements based on a video signal, and
a display control unit for sending the video signal to the display apparatus.

(10) A light emitting apparatus, including:
a light emitting element having a biased intensity distribution in a first direction and a uniform intensity distribution in a second direction orthogonal to the first direction; and
a mounting substrate where a plurality of the light emitting elements are arranged along a surface of the mounting substrate in a predetermined direction as the second direction.

(11) A display apparatus, including:
a light emitting unit including one pixel configured of a plurality of light emitting elements each having a biased intensity distribution in a first direction and a uniform intensity distribution in a second direction orthogonal to the first direction and having different light emitting wavelengths each other;
a mounting substrate where a plurality of the light emitting elements are arranged along a surface of the mounting substrate in a predetermined direction as the second direction; and
a driving circuit for driving the light emitting elements based on a video signal.

(12) An electronic device, including:
a display apparatus, including:
a light emitting unit including one pixel configured of a plurality of light emitting elements each having a biased intensity distribution in a first direction and a uniform intensity distribution in a second direction orthogonal to the first direction and having different light emitting wavelengths each other;
a mounting substrate where a plurality of the light emitting units are arranged such that the biased light properties are complemented within a group configured of the light emitting elements having the same wavelength and at least two light emitting units of a plurality of the light emitting units; and
a driving circuit for driving the light emitting elements based on a video signal, and
a display control unit for sending the video signal to the display apparatus.

(13) A light emitting unit, including:
a mounting substrate;
a three or more light emitting elements arranged on the mounting substrate being arranged in first and second directions orthogonal to each other and biased each other in the second direction where a requested view angle in the first direction is higher than that in the second direction.

(14) The light emitting unit according to (13) above, in which
a displacement amount of the light emitting elements arranged and biased each other is based on a size of the light emitting elements.

(15) A display apparatus, including:
a light emitting unit including,
a first mounting substrate, and
one pixel configured of three or more light emitting elements arranged on the first mounting substrate being arranged in first and second directions orthogonal to each other where a requested view angle in the first direction is higher than that in the second direction and biased in the second direction;
a second mounting substrate on which a plurality of the light emitting units are arranged; and
a driving circuit for driving the light emitting elements based on a video signal.

(16) An electronic device, including:
a display apparatus, including:
a light emitting unit including,
a first mounting substrate, and
one pixel configured of three or more light emitting elements arranged on the first mounting substrate being arranged in first and second directions orthogonal to each other where a requested view angle in the first direction is higher than that in the second direction and biased in the second direction;
a second mounting substrate on which a plurality of the light emitting units are arranged; and
a driving circuit for driving the light emitting elements based on a video signal, and
a display control unit for sending the video signal to the display apparatus.

(17) A light emitting element, including:
a semiconductor layer where a first conductive layer, an active layer and a second conductive layer are laminated,
a first electrode layer electrically connected to the first conductive layer,
a second electrode layer electrically connected to the second conductive layer; and
a reflection layer formed in contacted with an opposite side of the first conductive layer of the first electrode,
the semiconductor layer, the first electrode layer, the second electrode layer and the reflection layer being offset from a middle of the light emitting element viewed from an upper face of the light emitting element.

(18) The light emitting element according to (17) above, in which
the reflection layer has at least one of a plurality of combinations of predetermined areas and predetermined reflectances in order to provide the uniform intensity distribution of the light emitting element.

(19) A light emitting apparatus, including:
a light emitting element, including:
a semiconductor layer where a first conductive layer, an active layer and a second conductive layer are laminated,
a first electrode layer electrically connected to the first conductive layer,
a second electrode layer electrically connected to the second conductive layer; and
a reflection layer formed in contacted with an opposite side of the first conductive layer of the first electrode,
the semiconductor layer, the first electrode layer, the second electrode layer and the reflection layer being offset from a middle of the light emitting element viewed from an upper face of the light emitting element, and
a mounting substrate on which a plurality of the light emitting elements.

(20) A display apparatus, including:
a light emitting unit including one pixel configured of a plurality of light emitting elements having different light emitting wavelengths each other, the light emitting elements each having
a semiconductor layer where a first conductive layer, an active layer and a second conductive layer are laminated,
a first electrode layer electrically connected to the first conductive layer,
a second electrode layer electrically connected to the second conductive layer;
a reflection layer formed in contacted with an opposite side of the first conductive layer of the first electrode, the semiconductor layer, the first electrode layer, the second electrode layer and the reflection layer being offset from a middle of each of the light emitting elements viewed from an upper face of each of the light emitting elements;
a mounting substrate on which a plurality of the light emitting units are arranged; and a driving circuit for driving the light emitting elements based on a video signal.

(21) An electronic device, including:
a display apparatus, including:
a light emitting unit including one pixel configured of a plurality of light emitting elements having different light emitting wavelengths each other, the light emitting elements each having
a semiconductor layer where a first conductive layer, an active layer and a second conductive layer are laminated,
a first electrode layer electrically connected to the first conductive layer,
a second electrode layer electrically connected to the second conductive layer, and
a reflection layer formed in contacted with an opposite side of the first conductive layer of the first electrode, the semiconductor layer, the first electrode layer, the second electrode layer and the reflection layer being offset from a middle of each of the light emitting elements viewed from an upper face of each of the light emitting elements,
a mounting substrate on which a plurality of the light emitting units are arranged,
a driving circuit for driving the light emitting elements based on a video signal, and
a display control unit for sending the video signal to the display apparatus.

It should be understood by those skilled in the art that various modifications, combinations, sub-combinations and alterations may occur depending on design requirements and other factors insofar as they are within the scope of the appended claims or the equivalents thereof.

(22) A light emitting apparatus, comprising:
a mounting substrate; and
a plurality of light emitting elements arranged on the mounting substrate, the plurality of light emitting elements comprising a first light emitting element having a first biased light emission intensity distribution and a second light emitting element having a second biased light emission intensity distribution,
wherein a group of light emitting elements including the first and second light emitting elements is arranged on the mounting substrate such that a cumulative light emission intensity distribution of the group of light emitting elements is less distorted than either the first biased light emission intensity distribution or the second biased light emission intensity distribution.

(23) The light emitting apparatus of claim 1, wherein the group of light emitting elements is arranged such that the first biased intensity distribution is biased in a first direction and the second biased intensity distribution is biased in a second direction different from the first direction.

(24) The light emitting apparatus of claim 2, wherein light intensity distributions of light emitting elements in the group of light emitting elements are in a point symmetry.

(25) The light emitting apparatus of claim 3, wherein the first light emitting elements comprises:
a semiconductor layer where a first conductive layer, an active layer and a second conductive layer are laminated,
a first electrode layer electrically connected to the first conductive layer; and
a second electrode layer electrically connected to the second conductive layer,
wherein the first electrode layer and the second electrode layer are offset from a center of the first light emitting element.

(26) The light emitting apparatus of claim 1, wherein the cumulative light emission intensity distribution of the group of light emitting elements is substantially uniform.

(27) A display apparatus, comprising:
a mounting substrate;
a plurality of light emitting units each including a pixel comprising light emitting elements having respective biased light emission intensity distributions and different light emitting wavelengths; and
a driving circuit configured to drive the plurality of light emitting units based on a video signal,
wherein the plurality of the light emitting units are arranged such that a cumulative light emission intensity distribution of a group of light emitting elements having a same wavelength and comprising light emitting elements in at least two of the plurality of the light emitting units is less distorted than any one of the respective biased light emission intensity distributions.

(28) The display apparatus according to claim 6, wherein the plurality of light emitting units comprises:
a plurality of light emitting units of a first type including a first light emitting unit comprising a first plurality of light emitting elements arranged so that a cumulative light emission intensity distribution of the first plurality of light emitting elements is biased in a first direction; and
a plurality of light emitting units of a second type including a second light emitting unit comprising a second plurality of light emitting elements arranged so that a cumulative light emission intensity distribution of the second plurality of light emitting elements is biased in a second direction different from the first direction,
wherein the plurality of light emitting units of the first type and the plurality of light emitting units of the second type are arranged in alternating rows on the mounting substrate.

(29) The display apparatus according to claim 6, wherein the plurality of light emitting units comprises:
a plurality of light emitting units of a first type including a first light emitting unit comprising a first plurality of light emitting elements arranged so that a cumulative light emission intensity distribution of the first plurality of light emitting elements is biased in a first direction; and
a plurality of light emitting units of a second type including a second light emitting unit comprising a second plurality of light emitting elements arranged as a 180 degree rotation of how the first plurality of light emitting elements are arranged so that a cumulative light emission intensity distribution of the second plurality of light emitting elements is biased in a second direction opposite the first direction,
wherein the plurality of light emitting units of the first type and the plurality of light emitting units of the second type are arranged in alternating rows on the mounting substrate.

(30) An electronic device, comprising:
a display apparatus, including:
a mounting substrate;
a plurality of light emitting units each including a pixel comprising light emitting elements having respective biased light emission intensity distributions and different light emitting wavelengths;
a driving circuit configured to drive the plurality of light emitting units based on a video signal; and
a display control unit configured to send the video signal to the display apparatus,
wherein the plurality of the light emitting units are arranged on the mounting substrate such that a cumulative light emission intensity distribution of a group of light emitting elements having a same wavelength and comprising light emitting elements in at least two of the plurality of light emitting units is less distorted than any one of the respective biased light emission intensity distributions.

(31) A light emitting apparatus, comprising:
a mounting substrate; and
a plurality of light emitting elements, each having a biased light emission intensity distribution in a first direction and a substantially uniform light emission intensity distribution in a second direction orthogonal to the first direction,
wherein the plurality of the light emitting elements are arranged along a surface of the mounting substrate such that each of the plurality of the light emitting units has a substantially uniform intensity distribution in a predetermined direction.

(32) A display apparatus, comprising:
a mounting substrate;
a plurality of light emitting elements, each having a biased light emission intensity distribution in a first direction and a substantially uniform light emission intensity distribution in a second direction orthogonal to the first direction; and
a driving circuit configured to drive the plurality of light emitting elements based on a video signal,
wherein the plurality of the light emitting elements are arranged along a surface of the mounting substrate such that each of the plurality of the light emitting units has a substantially uniform intensity distribution in a predetermined direction.

(33) An electronic device, comprising:
a display apparatus, including:
a mounting substrate;
a plurality of light emitting units each including a pixel comprising light emitting elements having respective biased light emission intensity distributions in a first direction, respective substantially uniform light emission intensity distributions in a second direction orthogonal to the first direction, and different light emitting wavelengths;
a driving circuit configured to drive the plurality of light emitting elements based on a video signal; and
a display control unit configured to send the video signal to the display apparatus,
wherein the plurality of the light emitting units are arranged such that a cumulative light emission intensity distribution of a group of light emitting elements having a same wavelength and comprising light emitting elements in at least two of the plurality of the light emitting units is less biased in the first direction than any one of the respective biased light emission intensity distributions in the first direction.

(34) A light emitting unit, comprising:
a mounting substrate;
at least three light emitting elements arranged on the mounting substrate along first and second directions orthogonal to each other and biased relative to each other in the second direction,
wherein a requested view angle in the first direction is higher than a requested view angle in the second direction.

(35) The light emitting unit according to claim 13, wherein the at least three light emitting elements are biased relative to each other in the second direction by being displaced relative to each other in the second direction, the amount of displacement being based on sizes of the at least three light emitting elements.

(36) A display apparatus, comprising:
a light emitting unit, including:
a first mounting substrate; and
a pixel comprising at least three light emitting elements arranged on the first mounting substrate along first and second directions orthogonal to each other and biased relative to each other in the second direction,
wherein a requested view angle in the first direction is higher than a requested view angle in the second direction;
a second mounting substrate on which a plurality of light emitting units including the light emitting unit are arranged; and
a driving circuit for driving the light emitting units based on a video signal.

(37) An electronic device, comprising:
a display apparatus, including:
a light emitting unit, including:
a first mounting substrate; and
a pixel comprising at least three light emitting elements arranged on the first mounting substrate along first and second directions orthogonal to each other and biased relative to each other in the second direction,
wherein a requested view angle in the first direction is higher than a requested view angle in the second direction;
a second mounting substrate on which a plurality of light emitting units including the light emitting unit are arranged; and
a driving circuit configured to drive the plurality of light emitting units based on a video signal, and
a display control unit configured to send the video signal to the display apparatus.

(38) A light emitting element, comprising:
a semiconductor layer where a first conductive layer, an active layer and a second conductive layer are laminated;
a first electrode layer electrically connected to the first conductive layer;
a second electrode layer electrically connected to the second conductive layer; and
a reflection layer formed in contact with an opposite side of the first conductive layer,
wherein the semiconductor layer, the first electrode layer, the second electrode layer, and the reflection layer are offset from a center of the light emitting element when viewed from an upper face of the light emitting element.

(39) The light emitting element according to claim 17, wherein:
the reflection layer has at least one of a plurality of combinations of predetermined areas and predetermined reflectances so that the light emitting element provide a substantially uniform light emission intensity distribution.

(40) A light emitting apparatus, comprising:
a mounting substrate; and
a plurality of light emitting elements arranged on the mounting substrate, a light emitting element of the plurality of light emitting elements including:
a semiconductor layer where a first conductive layer, an active layer and a second conductive layer are laminated;
a first electrode layer electrically connected to the first conductive layer;
a second electrode layer electrically connected to the second conductive layer; and
a reflection layer formed in contact with an opposite side of the first conductive layer of the first electrode,
wherein the semiconductor layer, the first electrode layer, the second electrode layer, and the reflection layer are offset from a center of the light emitting element when viewed from an upper face of the light emitting element.

(41) A display apparatus, comprising:
a mounting substrate;
a plurality of light emitting units arranged on the mounting substrate, a light emitting unit of the plurality of light units including one pixel configured of a plurality of light emitting elements having different light emitting wavelengths, each of the plurality of light emitting elements having:
a semiconductor layer where a first conductive layer, an active layer and a second conductive layer are laminated,
a first electrode layer electrically connected to the first conductive layer,
a second electrode layer electrically connected to the second conductive layer;
a reflection layer formed in contact with an opposite side of the first conductive layer of the first electrode,
wherein the semiconductor layer, the first electrode layer, the second electrode layer, and the reflection layer are offset from a center of the light emitting element when viewed from an upper face of the light emitting element; and
a driving circuit configured driving the plurality of light emitting units based on a video signal.

(42) An electronic device, comprising:
a display apparatus, including:
a mounting substrate;
a plurality of light emitting units arranged on the mounting substrate, a light emitting unit of the plurality of light emitting units including a pixel comprising a plurality of light emitting elements having different light emitting wavelengths, each of the plurality of light emitting elements having:
a semiconductor layer where a first conductive layer, an active layer and a second conductive layer are laminated,
a first electrode layer electrically connected to the first conductive layer,
a second electrode layer electrically connected to the second conductive layer, and
a reflection layer formed in contact with an opposite side of the first conductive layer of the first electrode,
wherein the semiconductor layer, the first electrode layer, the second electrode layer, and the reflection layer are offset from a center the light emitting element when viewed from an upper face the light emitting element;
a driving circuit configured to drive the light emitting units based on a video signal; and
a display control unit configured to send the video signal to the display apparatus.

(43) A light emitting apparatus, comprising:
a mounting substrate; and
a plurality of light emitting elements arranged on the mounting substrate and comprising a first light emitting element and a second light emitting element, the first light emitting element comprising a first positive electrode offset in a first direction from a center of the first light emitting element, the second light emitting element comprising a second positive electrode offset in a second direction from a center of the second light emitting element,
wherein the first and second light emitting elements are arranged on the mounting substrate such that a cumulative light emission intensity distribution of first and second light emitting elements is less distorted than either a light emission intensity distribution of the first light emitting element or a light emission intensity distribution of the second light emitting element.

(44) The light emitting apparatus of claim 22, wherein the cumulative light emission distribution of the first positive electrode and the second positive electrode is substantially uniform.

(45) A light emitting apparatus, comprising:
a mounting substrate; and
a plurality of light emitting elements arranged on the mounting substrate, at least three of the plurality of light emitting elements having respective biased light emission intensity distributions,
wherein the at least three of the light emitting elements are arranged on the mounting substrate such that a cumulative light emission intensity distribution of the at least three of the light emitting elements is less distorted in a first direction than any one of the respective biased light emission intensity distribution.

(46) The light emitting apparatus of claim 24, wherein the cumulative light emission intensity distribution is substantially uniform in the first direction.

(47) A light emitting apparatus, comprising:
a mounting substrate; and
a plurality of light emitting elements arranged on the mounting substrate, the plurality of light emitting elements comprising first, second, and third light emitting elements having respective biased light emission intensity distributions,
wherein the first, second, and third light emitting elements are arranged on the mounting substrate such that a cumulative light emission intensity distribution of the at least three of the light emitting elements is less distorted in a first direction than any one of the respective biased light emission intensity distributions, and wherein no two elements of the first, second and third light emitting elements are arranged in parallel to one another in the first direction.

(48) The light emitting apparatus of claim 26, wherein the cumulative light emission intensity distribution is substantially uniform in the first direction.

What is claimed is:
1. A light emitting apparatus, comprising:
a mounting substrate; and
a plurality of light emitting elements arranged on the mounting substrate, the plurality of light emitting elements comprising:
a first light emitting element having a first light emitting wavelength distribution that deviates from a uniform distribution in a first direction; and
a second light emitting element having a second light emitting wavelength distribution that deviates from the uniform distribution in a second direction different from the first direction,
wherein a group of light emitting elements including the first and second light emitting elements is arranged on the mounting substrate such that a cumulative light emitting wavelength distribution of the group of light emitting elements is closer to the uniform distribution than either the first light emitting wavelength distribution or the second light emitting wavelength distribution.

2. The light emitting apparatus of claim 1, wherein light emitting wavelength distributions of light emitting elements in the group of light emitting elements are in a point symmetry.

3. The light emitting apparatus of claim 2, wherein at least one of the first light emitting elements comprises:
a semiconductor layer where a first conductive layer, an active layer and a second conductive layer are laminated,
a first electrode layer electrically connected to the first conductive layer; and
a second electrode layer electrically connected to the second conductive layer,
wherein the first electrode layer and the second electrode layer are offset from a center of the first light emitting element.

4. The light emitting apparatus of claim 1, wherein the cumulative light emitting wavelength distribution of the group of light emitting elements is substantially uniform.

5. A light emitting apparatus, comprising:
a mounting substrate; and
a plurality of light emitting elements arranged on the mounting substrate, at least three of the plurality of light emitting elements having respective biased light emitting wavelength distributions,
wherein the at least three of the light emitting elements are arranged on the mounting substrate such that a cumulative light emitting wavelength distribution of the at least three of the light emitting elements is less distorted in a first direction than any one of the respective light emitting wavelength distributions.

6. The light emitting apparatus of claim 5, wherein the cumulative light emitting wavelength distribution is substantially uniform in the first direction.

* * * * *